United States Patent [19]
Yoshimura

[11] Patent Number: 5,502,682
[45] Date of Patent: Mar. 26, 1996

[54] SEMICONDUCTOR INTEGRATED CIRCUIT FOR CONTROLLING POWER SOURCE

[75] Inventor: Yoshimasa Yoshimura, Itami, Japan

[73] Assignee: Mitsubishi Denki Kabushiki Kaisha, Tokyo, Japan

[21] Appl. No.: 386,807

[22] Filed: Feb. 6, 1995

[30] Foreign Application Priority Data

Feb. 7, 1994 [JP] Japan .................................. 6-013362
Dec. 27, 1994 [JP] Japan .................................. 6-325825

[51] Int. Cl.$^6$ .................................................. G11C 13/00
[52] U.S. Cl. ........................... 365/226; 365/227; 365/229
[58] Field of Search .................................. 365/226, 227, 365/229, 189.01

[56] References Cited

U.S. PATENT DOCUMENTS 5,448,526  9/1995  Horiguchi et al. ................. 365/189.01

*Primary Examiner*—Terrell W. Fears
*Attorney, Agent, or Firm*—Leydig, Voit & Mayer

[57] ABSTRACT

A semiconductor integrated circuit for controlling a power source with which a power source potential on the basis of different external power source potentials, for example, 5 V and 3 V, can accurately be obtained. The semiconductor integrated circuit for switching between an external power source and a backup power source has an arrangement that, when the external power source potential is supplied to an external power source potential node, the potential at a first connection node on the basis of the external power source potential and a first reference potential of a first reference potential generating circuit are subjected to a comparison by a first comparator, and a first power source potential discriminating portion transmits a first comparison result signal. The potential of a second connection node and a second reference potential of a second reference potential generating circuit are subjected to a comparison by a second comparator, and a second power source potential discriminating portion transmits a second comparison result signal. If the potential of a setting node is high, a switching signal output portion transmits a switching signal corresponding to the first comparison result and transmits a switching signal corresponding to the second comparison result signal if the potential of the setting node is low. If the switching signal indicates a high level, a transistor connected to the external power source potential node is turned on. If the same indicates a low level, a transistor connected to the backup power source is turned on.

20 Claims, 20 Drawing Sheets

SEMICONDUCTOR INTEGRATED CIRCUIT FOR CONTROLLING POWER SOURCE

BACKGROUND OF THE INVENTION

1. Field of the Invention

This invention relates to a semiconductor integrated circuit for controlling a power source for use such that the semiconductor integrated circuit is mounted on a memory card which has a primary battery and/or a second battery serving as backup power sources for a RAM of the memory card.

More particularly, the present invention relates to a semiconductor integrated circuit for controlling a power source such that if the semiconductor integrated circuit has detected drop or interruption of power source potential that is supplied from a terminal unit on a system to a memory card, then it switches the power supply from the terminal unit on the system to a backup power source and, if it has detected drop of the power source potential of the primary battery, then it transmits an alarm signal for urging the primary battery to be changed.

2. Description of the Related Art

Initially, the usual structure of a memory card will now be described with reference to FIGS. 16, 17 and 18.

Referring to FIG. 16, a memory card 2 is electrically connected to a terminal unit 1 of a system through a connector in such a manner that the memory card 2 is connected to the terminal unit 1 of the system through a power source potential supply line 3, a ground potential line 4 and an alarm signal line 5, the memory card 2 being as well as connected to the same through data lines and the like.

The memory card 2 has a semiconductor integrated circuit 6 for controlling a power source, a storage means 7, a first backup power source 8, a second backup power source 9, a setting means 10 and a control means 11, which are mounted thereon.

Note that a memory card 2A having only the first backup power source 8 mounted thereon and a memory card 2B having only the second backup power source 9 mounted thereon as shown in FIGS. 17 and 18 have been used. Therefore, memory cards are classified into three types on the basis of the state where the backup power source is mounted. It should be noted that the memory cards respectively are structured into the types that are adaptable to rated power source potentials of the terminal unit 1 of the system, as will be described later.

In case where the memory card 2 is connected to the terminal unit 1 of the system through the connector, the semiconductor integrated circuit 6 for controlling a power source usually supplies, to the memory card 2, power supplied from the terminal unit 1 of the system through the power source potential supply line 3.

If the foregoing integrated circuit 6 has detected drop or interruption of the power source potential supplied from the terminal unit 1 of the system, the integrated circuit 6 switches supply of the power to be used in the memory card 2 so that the power is supplied from the first backup power source 8 or the second backup power source 9. In a case where the memory card 2 has been removed from the terminal unit 1 of the system, the foregoing integrated circuit 6 similarly switches the power supply.

The foregoing integrated circuit 6 detects whether or not the power source potential of the first backup power source 8 is sufficiently high for the storage means 7 to store data. If the potential is unsatisfactorily low, the foregoing integrated circuit 6 transmits, to the terminal unit 1 of the system through the alarm signal line 5, an alarm signal for urging the first backup power source 8 to be changed.

In recent years, voltage levels of, for example, 5 V and 3 V, have been rated as the power source potential for the terminal unit 1 of the system and, thus, two types of memory cards have been required. The semiconductor integrated circuit 6 for controlling a power source has a structure adaptable to the two types. Furthermore, the semiconductor integrated circuit 6 for controlling a power source is made to be adaptable to the memory card 2 having the first and second backup power sources 8 and 9 mounted thereon and also to the memory cards 2A and 2B each having only either of the same. Therefore, the foregoing integrated circuit 6 can be adapted to a total of six kinds of memory cards.

The storage means 7 comprises, for example, a RAM, which requires backup of a power source. If the rated power source potential of the terminal unit 1 of the system is 5 V, a RAM, the operation of which is guaranteed at 4.5 V to 5.5 V, has been used. If the rated value is 3 V, a RAM, the operation of which is guaranteed at 2.7 V to 3.3 V has been used. In a case where only storage of data is performed, a RAM requiring only about 2 V of a power source has been used.

The first backup power source 8 comprises a primary battery, such as a button-shape battery, the power source potential of which is, for example, 3 V and to which electric power cannot be charged.

The second backup power source 9 comprises a second battery, the power source potential of which is, for example 3 V and to which electric power can be supplied. When the power source potential has been lowered, the second battery is charged with electric power from the power source of the terminal unit 1 of the system supplied through the power source potential supply line 3 by means of a circuit (not shown).

The setting means 10 sets the memory card to be adaptable to the rated value of the power source potential of the terminal unit 1 of the system of 5 V or 3 V. When the semiconductor integrated circuit 6 for controlling a power source is mounted on the memory card, the setting means sets the rated value to which the memory card is adapted.

The control means 11 sets the memory card to be adaptable to the state where the backup power source is mounted such that the memory card is adapted to either one of the first and second backup power sources 8 and 9, or both the first and second backup power sources 8 and 9. When the semiconductor integrated circuit 6 for controlling a power source is mounted on the memory card, the control means sets the memory card to the selected state.

Then, the operation of the foregoing integrated circuit 6 will now be described. First, the operation to be performed when the memory card 2 is connected to the terminal unit 1 of the system will now be described. The semiconductor integrated circuit 6 for controlling a power source is supplied with the power source potential of the terminal unit 1 of the system supplied through the power source potential supply line 3. If the supplied power source potential is a predetermined rated value, the semiconductor integrated circuit 6 for controlling a power source supplies the foregoing power source potential to the circuit in the memory card 2 including the storage means 7. The memory card 2, which is operated with the power source potential of the terminal unit 1 of the system, writes data transferred from the terminal unit 1 of the system and transfers data read from storage means 7 to the terminal unit 1 of the system.

If the power source potential supplied from the terminal unit 1 of the system is lower than the rated value or if the memory card 2 has been removed from the terminal unit 1 of the system, the foregoing integrated circuit 6 detects the foregoing state and switches the supply of the power source potential from the terminal unit 1 of the system to the supply of the power source potential from the first or second backup power sources 8 or 9 to supply the power source potential to the storage means 7. Since the power source potentials of the first and second backup power sources 8 and 9 have smaller power source capacity as compared with the power source potential of the terminal unit 1 of the system, the power source potential is used only to store data of the storage means 7.

The conventional semiconductor integrated circuit for controlling a power source will now be described specifically with reference to FIGS. 19–21.

Referring to FIG. 19, reference numeral 6a represents an external power source potential node connected to the power source potential supply line 3 through the connector and serving as a system-side power source potential node, 6b represents an internal power source potential node for supplying the internal power source potential to the internal circuit of the memory card 2 including the storage means 7, 6c represents an alarm signal output node connected to the alarm signal line 5 though a connector, 6d represents a first backup power source potential node which is supplied with a first backup power source potential from the first backup power source 8, 6e represents a second backup power source potential node supplied with a second backup power source potential from the second backup power source 9, 6f represents a setting node for receiving a setting signal from the setting means 10 and 6g represents a control node for receiving a control signal from the control means The foregoing integrated circuit 6 comprises a power source potential discriminating means (circuit) 61, a power source switching means (circuit) 62 and an alarm signal generating means (circuit) 63.

The power source potential discriminating means 61 transmits a switching signal for discriminating whether the external power source potential to be supplied to the external power source potential node 6a or the first or second backup power source potential to be supplied to the first backup power source potential node 6d or the second backup power source potential node 6e is used. That is, the power source potential discriminating means 61 detects whether the memory card 2 is connected to the terminal unit 1 of the system and whether the power source potential supplied from the terminal unit 1 of the system is the rated value in a case where the memory card 2 is connected to the terminal unit 1 of the system. In a case where the memory card 2 is not connected to the terminal unit 1 of the system and in a case where the power source potential of the terminal unit 1 of the system is lower than the rated value, the power source potential discriminating means 61 transmits the switching signal upon which the backup power sources 8 and 9 are used. In a case where the power source potential of the terminal unit 1 of the system is the rated value, the power source potential discriminating means 61 transmits the switching signal upon which the power source potential of the terminal unit 1 of the system is used.

The power source potential discriminating means 61 is in series connected between the external power source potential node 6a and the ground potential node and comprises a potential generating means, a reference potential generating means 61e and a comparison means 61d. The potential generating means comprises resistors 61a and 61b and as well as having a connection node 61c connected to the setting node 6f. The comparison means 61d is operated with the power source potential of the terminal unit 1 of the system supplied through the power source potential supply line 3, the comparison means 61d having an input node connected to the connection node 61c and another input node that receives a reference potential from the reference potential generating means 61e. The comparison means 61d transmits a switching signal upon which the external power source potential is used if the potential appeared at the connection node 61c is higher than the reference potential, the comparison means 61d transmitting a switching signal upon which the backup power source potential is used if the foregoing potential is lower than the reference potential. In this example, if the potential appeared at the connection node 61c is higher than the reference potential, then the level of the switching signal is high. If the foregoing potential is lower than the reference potential, the level of the switching signal is low.

Note that the reference potential generating means 61e, as shown in FIG. 20, comprises a constant electric current source I1 connected between the power source potential node (the external power source potential node 6a in this example) and an output node 01 (Output 1), an npn bipolar transistor Tr1 having a collector and a base connected to the output node 01 and acting as a diode device, and a resistor R1 connected between the emitter the transistor Tr1 and the ground node. The reference potential generating means 61e has a small number of circuit elements and as well as causes the reference potential appearing at the output node 01 to be stable against change in the power source potential (even if the voltage level is 5 V or 3 V) supplied to the power source potential node and the temperature.

Examples of the resistors 61a and 61b of the potential generating means and the reference potential generating means 61e of the power source potential discriminating means 61 are as follows.

The reference potential generating means 61e is enabled to generate the reference potential of 1.35 V by determining the circuit constants of the constant electric current source I1, the transistor Tr1 and the resistor R1.

The resistors 61a and 61b of the potential generating means have the same resistance value of, for example, 600 KΩ in order to cause a voltage level of 1.35 V to appear at the connection node 61c when the power source potential of the terminal unit 1 of the system supplied to the external power source potential node 6a is 2.7 V under condition that the setting node 6f is electrically floating, that is, the switching means 10a of the setting means 10 is opened in a case where the storage means 7, the operation of which is guaranteed in a power source potential range from 2.7 V to 3.3 V, is used (in a case where the memory card is adapted to the rated value of the power source potential the terminal unit 1 of the system of 3 V).

It should be noted that the setting means 10 according to this example is in series connected between the setting node 6f and the ground node and comprises the switching means 10a and a resistor 10b. When the rated power source potential of the terminal unit 1 of the system is 3 V, the switching means 10a is opened. When the rated power source potential is 5 V, the switching means 10a is closed. The resistor 10b, together with the resistors and 61b of the potential generating means, acts to generate a potential at the connection node 61c in a case where the storage means 7, the operation of which is guaranteed in a power source potential range from 4.5 V to 5.5 V, is used. The resistance value of the resistor 10b is 450 kΩ when each of the resistors 61a and 61b has the resistance value of 600 kΩ in order to cause a voltage level of 1.35 V to appear at the connection node 61c in a case where the power source potential of the terminal unit 1 of the system supplied to the external power source potential node 6a is 4.5 V.

The power source switching means 62 receives the power source potential of the terminal unit 1 of the system supplied to the external power source potential node 6a and those of the first and second backup power sources 8 and 9. Furthermore, the power source switching means 62 receives the switching signal from the power source potential discriminating means 61 and the control signal from the control means 11. In response to the switching signal, the power source switching means 62 selects the power source potential of the terminal unit 1 of the system or the power source potentials of the first and second backup power sources 8 and 9 to transmit the selected power source potential to the internal power source potential node 6b.

The power source switching means 62 is connected between the external power source potential node 6a and the internal power source potential node 6b. The power source switching means 62 comprises a P-channel MOS transistor 62a, an invertor means (an inverting circuit) 62b, a logical operating means 62c, a P-channel MOS transistor 62d, a P-channel MOS transistor 62e and a bypass means 62f.

The transistor 62a has a backgate connected to the internal power source potential node 6b so that conduction of the transistor 62a is controlled in response to the switching signal. The invertor means 62b is operated with the power source potentials of the first and second backup power sources 8 and 9. The invertor means 62b has an input node, which receives the switching signal, and an output node which is connected to the transistor 62a. The logical operating means 62c is operated with the power source potentials of the first and second backup power sources 8 and 9. The logical operating means 62c has an input node that receives the switching signal and another input node that is connected to the control node 6g. Thus, the logical operating means 62c transmits a control signal upon which whether or not the first backup power source 8 is connected to the internal power source potential node 6b is determined.

The transistor 62d is connected between the first backup power source potential node 6d and the internal power source potential node 6b. The P-channel MOS transistor 62d has a backgate connected to the internal power source potential node 6b and a gate electrode that receives the control signal from the logical operating means 62c. Thus, conduction of the transistor 62d is controlled in response to the control signal. The transistor 62e is connected between the second backup power source potential node 6e and the internal power source potential node 6d. The transistor 62e has a backgate connected to the internal power source potential node 6b and a gate electrode which receives the switching signal. In response to the switching signal, conduction of the transistor 62e is controlled. The bypass means 62f comprises a diode device 62f1 and a resistor 62f2 in series connected between the first backup power source potential node 6d and the internal power source potential node 6b. The anode electrode of the diode device 62f1 is connected to the first backup power source potential node 6d.

The logical operating means 62c comprises, for example, an OR circuit. When a high level potential (that is, the memory card 2 having the first and second backup power sources 8 and 9 mounted thereon or the memory card 2B having only the second backup power source 9 mounted thereon is loaded) is supplied to the control node 6g, the logical operating means 62c transmits a high-level control signal regardless of the level of the switching signal. When a low level potential (the memory card 2A having only the first backup power source 8 mounted thereon is loaded) is supplied to the control node 6g, the logical operating means 62c transmits a high-level control signal if the switching signal is high level and transmits a low-level control signal if the switching signal is low level.

When the gate electrode of the transistor 62d receives a low level signal, the transistor 62d is brought to a conductive state. When the same receives a high level signal, the transistor 62d acts as a diode device (in this example, the forward voltage (the threshold) is 0.6 V), the forward direction of which is arranged from the first backup power source potential node 6d to the internal power source potential node 6b, because the backgate of the transistor 62d is connected to the internal power source potential node 6b.

When the gate electrode of the transistor 62e receives a low level potential, the transistor 62e is brought to a conductive state. When the same receives a high level potential, the transistor 62d acts as a diode device (in this example, the forward voltage (the threshold) is 0.6 V), the forward direction of which is arranged from the second backup power source potential node 6e to the internal power source potential node 6b, because the backgate of the transistor 62d is connected to the internal power source potential node 6b.

The control means 11, in this example, comprises a control node 6g and a switching means 11a which establishes the electrical connection between the control node 6g and the power source potential node (which is the internal power source potential node 6b in this example) or the ground node.

The alarm signal generating means 63 comprises a reference potential generating means 63a for generating the reference potential and a comparison means 63b. The alarm signal generating means 63 discriminates whether or not the power source potential of the first backup power source 8 is sufficiently high (a predetermined potential, for example, about 2 V) for the storage means 7 to store data. If the power source potential of the first backup power source 8 is lower than the predetermined potential, the alarm signal generating means 63 transmits an alarm signal for urging change of the first backup power source 8 to the terminal unit 1 of the system through the alarm signal line 5. The comparison means 63b is operated with the power source potential of the terminal unit 1 of the system supplied to the external power source potential node 6a. The comparison means 63b has an input node which is connected to the first backup power source potential node 6d and another input node which receives the reference potential from the reference potential generating means 63a, the comparison means 63b further having an output node connected to the alarm signal output node 6c.

Note that the reference potential generating means 63a, as shown in FIG. 21, comprises a constant electric current source I2 connected between the power source potential node (the external power source potential node 6a in this example) and an output node 02 (Output 2), an npn bipolar transistor Tr2 having a collector and a base connected to the output node 02 and acting as a diode device, an npn bipolar transistor tr3 having a collector and a base connected to the emitter of the transistor tr2 and acting as a diode device, and a resistor R2 connected between the emitter of the transistor Tr3 and the ground node. The reference potential generating means 63a has a small number of circuit elements and as well as causes the reference potential appearing at the output node 02 to be stable against change in the power source potential (even if the voltage level is 5 V or 3 V) supplied to the power source potential node and the temperature.

Specifically, the reference potential generating means 63a is enabled to generate the reference potential of, for example, 2.6 V, by determining the circuit constants of the constant electric current source I2, the transistors Tr2 and Tr3 and the resistor R2.

The operation of the semiconductor integrated circuit 6 for controlling a power source will now be described. First, the foregoing integrated circuit 6 adaptable to the memory card 2 adapted to the rated power source potential of the terminal unit 1 of the system of 3 V and having both first and second backup power sources 8 and 9 will now be described.

The foregoing memory card 2 comprises the storage means 7 comprising a RAM, the operation of which is guaranteed at 2.7 V to 3.3 V. The switching means 10a of the setting means 10 is opened, and the switching means 11a of the control means 11 establishes the electrical connection between the internal power source potential node 6b and the control node 6g.

When the memory card 2 is connected to the terminal unit 1 of the system in the foregoing state, the power source potential of the terminal unit 1 of the system is supplied to the external power source potential node 6a through the power source potential supply line 3.

As a result, the potential on the basis of the power source potential of the terminal unit 1 of the system appeared at the external power source potential node 6a, that is, the potential, which has been resistance-divided by the resistors 61a and 61b of the potential generating means, appears at the connection node 61c. The potential of the connection node 61c and the reference potential (which is 1.35 V in this example) of the reference potential generating means 61e are subjected to a comparison by the comparison means 61d. If the potential of the connection node 61c is higher than the reference potential, a high-level switching signal indicating that the power source potential of the terminal unit 1 of the system is used as the internal power source potential is transmitted.

The high-level switching signal is inverted by the invertor means 62b so that a low level potential is supplied to the transistor 62a. Since the transistor 62a that has received the low level at the gate electrode thereof is brought to the conductive state, the power source potential of the terminal unit 1 of the system appeared at the external power source potential node 6a appears at the internal power source potential node 6b through the transistor 62a. Thus, the power source potential of the terminal unit 1 of the system is supplied to the internal circuit of the memory card 2 including the storage means 7.

The memory card 2, which is operated with the power source potential of the terminal unit 1 of the system, writes data transferred from the terminal unit I of the system on the storage means 7 or transfers data read from the storage means 7 to the terminal unit 1 of the system.

The high-level switching signal is also supplied to the gate electrode of the transistor 62e so that the transistor function of the transistor 62e is brought to a non-conductive state.

Therefore, the power source potential is not supplied from the second backup power source 9 to the internal power source potential node 6b so far as the potential of the internal power source potential node 6b is higher than a value obtained by subtracting the threshold for the transistor 62e to serve as a diode device from the power source potential of the second backup power source 9. Since the comparison means 61d has discriminated that the power source potential of the terminal unit 1 of the system is 2.7 V or higher and thus the power source potential of the terminal unit 1 of the system is supplied to the internal power source potential node 6b, the power source potential of the internal power source potential node 6b is 2.7 V or higher. Therefore, the power source potential is not supplied from the second backup power source 9 to the internal power source potential node 6b.

Since a high-level control signal is supplied from the control means 11 to one input node of the logical operating means 62c, a high-level control signal is transmitted from the logical operating means 62c regardless of the level of the switching signal. The high-level control signal is supplied to the gate electrode of the transistor 62d so that the transistor function of the transistor 62d is brought to s non-conductive state.

Therefore, the power source potential is not supplied from the first backup power source 8 to the internal power source potential node 6b so far as the potential of the internal power source potential node 6b is higher than a value obtained by subtracting the threshold for the transistor 62d to serve as a diode device from the power source potential of the first backup power source 8. Since the comparison means 61d has discriminated that the power source potential of the terminal unit 1 of the system is 2.7 V or higher and thus the power source potential of the terminal unit 1 of the system is supplied to the internal power source potential node 6b, the power source potential of the internal power source potential node 6b is 2.7 V or higher. Therefore, the power source potential is not supplied from the first backup power source 8 to the internal power source potential node 6b through the transistor 62d.

Furthermore, since the power source potential of the internal power source potential node 6b is higher than the value obtained by subtracting the threshold of the diode 62f1 from the first backup power source 8, no electric power is supplied from the first backup power source 8 to the internal power source potential node 6b through the bypass means 62f.

Furthermore, the comparison means 63b of the alarm signal generating means 63 subjects the power source potential of the first backup power source 8 and the reference potential (which is 2.6 V in this example) of the reference potential generating means 63a to a comparison. If the power source potential of the first backup power source 8 is lower than the reference potential, the comparison means 63b transmits an alarm signal for instructing the change of the first backup power source 8 to the terminal unit 1 of the system through the alarm signal line 5.

If the power source potential of the terminal unit of the system has been made lower than 2.7 V due to some reason during use under the foregoing condition, the potential of the connection node 61c of the power source potential discriminating means 61 is made lower than the reference potential (which is 1.35 V in this example) of the reference potential generating means 61e. Thus, the comparison means 61d transmits a low-level switching signal indicating that the backup power source is used as the internal power source potential.

The low-level switching signal is inverted by the invertor means 62b so that a high-level signal is supplied to the transistor 62a. The transistor function of transistor 62a that has received the high-level signal at the gate electrode thereof is brought into a non-conductive state. Since the power source potential of the terminal unit 1 of the system is lower than 2.7 V, supply and receipt of data between the memory card 2 and the terminal unit 1 of the system are inhibited.

The low-level switching signal is also supplied to the gate electrode of the transistor 62e so that the transistor 62e is brought to a conductive state.

Therefore, the second backup power source 9 and the internal power source potential node 6b are brought to an electrically conductive state. Thus, the power source potential can be supplied from the second backup power source 9 to the internal power source potential node 6b so that the power source potential of the internal power source potential node 6b is supplied from the second backup power source 9.

As a result, the storage means 7 is supplied with the power source potential from the second backup power source 9, and thus an undesirable loss of data stored in the storage means 7 can be prevented.

Since the transistor 62d has received the high-level control signal from the logical operating means 62c, the transistor function of the transistor 62d is in a non-conductive state. Therefore, the power source potential is not supplied from the first backup power source 8 to the internal power source potential node 6b so far as the power source potential of the internal power source potential node 6b is higher than the value obtained by subtracting the threshold for the diode function of the transistor 62d from the first backup power source 8.

When the supply of the power source potential to the internal power source potential node 6b is switched from the terminal unit 1 of the system to the second backup power source 9, scatter of the circuit devices taking place during manufacturing sometimes causes the transistor 62e to be brought to a conductive state after the transistor 62a has been brought to a non-conductive state.

However, the structure of this example, in which the transistors 62e and 62d act as diode devices and the bypass means 62f is provided, causes the power source potential to be supplied from the first backup power source 8 or the second backup power source 9 to the internal power source potential node 6b when the potential of the internal power source potential node 6b has been made lower than the value obtained by subtracting the threshold for the transistor 62e or 62d to serve as the diode device or the threshold of the diode device 62f7 of the bypass means 62f from the power source potential of the first backup power source 8 or the second backup power source 9. As a result, the potential of the internal power source potential node 6b cannot be made lower than a certain level. Therefore, the problem of loss of data stored in the storage means 7 can be prevented.

Then, the operation of the foregoing integrated circuit 6 adapted to the memory card 2b having only the second backup power source 9 mounted thereon will now be described.

Also in this case, the integrated circuit 6 is operated similarly to the foregoing integrated circuit 6 that is adapted to the memory card 2 having the first and second backup power sources 8 and 9 mounted thereon.

However, since the first backup power source 8 is omitted from the structure, the supply of the power source potential from the first backup power source 8 to the internal power source potential node 6b is interrupted but the power source potential is supplied from the second backup power source 9 if scatter of the circuit device taking place due to manufacturing brings the transistor 62e to a conductive state after the transistor 62a has been brought to a non-conductive state when the supply of the power source potential to the internal power source potential node 6b is switched from the terminal unit 1 of the system to the second backup power source 9. Therefore, no problem is raised.

Then, the operation of the foregoing integrated circuit 6 adapted to the memory card 2A having only the first backup power source 8 mounted thereon will now be described.

In this case, the control means 11 is set to a state where the ground potential node and the control node 6g are electrically connected by the switching means Therefore, one of the inputs of the logical operating means 62c receives the low-level control signal. Thus, the logical operating means 62c transmits a control signal, the level of which corresponds to the level of the foregoing switching signal.

In a case where the power source potential of the terminal unit 1 of the system is sufficiently high and therefore the power source potential of the terminal unit of the system is supplied to the internal power source potential node 6b, a high-level switching signal is transmitted from the power source potential discriminating means 61. The transistor 62a that has received a low level potential at the gate electrode thereof through the invertor means 62b is brought to a conductive state. As a result, the memory card 2A, which is operated with the power source potential of the terminal unit 1 of the system, writes data transferred from the terminal unit 1 of the system or transfers data read from the storage means 7 to the terminal unit 1 of the system.

On the other hand, the logical operating means 62c, which receives the high-level switching signal at another input node thereof, transmits high level. The transistor function of the transistor 62d, which receives the high-level control signal at the gate electrode thereof, is brought to a non-conductive state. Therefore, the power source potential of the internal power source potential node 6b is not made lower than the predetermined level. Thus, the power source potential is not supplied from the first backup power source 8 to the internal power source potential node 6b through the transistor 62d and the bypass means 62f.

If the power source potential of the terminal unit of the system has been lowered due to some reason and therefore a low-level switching signal has been transmitted from the power source potential discriminating means 61, the transistor function of the transistor 62a, which has received a high level at the gate electrode thereof through the invertor means 62b, is brought into a non-conductive state. Since the power source potential of the terminal unit 1 of the system is lower than 2.7 V at this time, transfer and receipt of data between the memory card 2A and the terminal unit 1 of the system are inhibited.

On the other hand, the output from the logical operating means 62c, which receives the low-level switching signal at another input node, is low level. The transistor function of the transistor 62d, which receives the low-level control signal at the gate electrode thereof, is brought to a conductive state.

Therefore, the first backup power source 8 and the internal power source potential node 6b are made to be electrically conductive. As a result, the power source potential can be supplied from the first backup power source 8 to the internal power source potential node 6b so that the power source potential is supplied to the internal power source potential node 6b from the first backup power source 8.

As a result, the storage means 7 is supplied with the power source potential from the first backup power source 8. Therefore, the problem of loss of data stored in the storage means 7 can be prevented.

In a case where the transistor 62d is brought to a conductive state after the transistor 62a has been brought to a non-conductive state due to scatter of the circuit device caused from manufacturing when the supply of the power source potential to the internal power source potential node 6b is switched from the terminal unit 1 of the system to the first backup power source 8, the structure of this example, in which the transistor 62d serves as a diode device and the bypass means 62f is provided, causes the power source potential to be supplied from the first backup power source 8 to the internal power source potential node 6b when the potential of the internal power source potential node 6b has been made lower than the value obtained by subtracting the threshold of the transistor 62d to serve as the diode device or the threshold of the diode device 62f1 of the bypass means 62f from the power source potential of the first backup power source 8. As a result, the potential of the internal power source potential node 6b cannot be made lower than a certain level. Therefore, a problem of loss of data stored in the storage means 7 can be prevented.

The comparison means 63b of the alarm signal generating means 63 subjects the power source potential of the first backup power source 8 and the reference potential (which is 2.6 V in this case) of the reference potential generating means 63a to a comparison. If the power source potential of the first backup power source 8 is lower than the reference potential, an alarm signal for instructing change of the first backup power source 8 is transmitted to the terminal unit 1 of the system through the alarm signal line 5.

The operation of the foregoing integrated circuit 6 adaptable to the memory card 2 adapted to the rated power source potential of the terminal unit 1 of the system of 3 V and having both first and second backup power sources 8 and 9 mounted thereon will now be described, the operation being performed when the memory card 2 has been removed from the terminal unit 1 of the system.

Since the comparison means 61d of the power source potential discriminating means 61 is operated by the power source for the terminal unit 1 of the system, the output from the comparison means 61d is lowered when the memory card 2 has been removed from the terminal unit 1 of the system.

Since invertor means 62b is operated by the backup power source, the invertor means 62b receives a low level from the comparison means 61d and supplies a high level to the gate electrode of the transistor 62a so as to bring the transistor function of the transistor 62a to a non-conductive state.

The transistor 62e, which receives the low level at the gate electrode thereof, is brought to a conductive state, thus causing the power source potential of the second backup power source 9 to be supplied to the internal power source potential node 6b.

Since the control means 11 has a structure to receive the power source potential from the internal power source, the output from the control means 11 is high level even if the memory card 2 has been separated from the terminal unit 1 of the system. Therefore, the logical operating means 62c, which is operated by the backup power source, receives a high level from the control means 11 and a low level from the comparison means 61d to supply a high level to the gate electrode of the transistor 62d. Thus, the logical operating means 62c brings the transistor function of the transistor 62d to a non-conductive state. As a result, the power source potential of the first backup power source 8 is not supplied to the internal power source potential node 6b.

In short, since the power source potential is supplied from the second backup power source 9 to the internal power source potential node 6b in a case where the memory card 2 has been removed from the terminal unit 1 of the system, the problem of loss of data stored in the storage means 7 can be prevented.

Since the comparison means 63b of the alarm signal generating means 63 is supplied with the power source potential from the terminal unit 1 of the system, it does not transmit the alarm signal.

The operation of the foregoing integrated circuit 6 adapted to the memory card adaptable to a rated power source potential of the terminal unit 1 of the system of 5 V will now be described.

In this case, the storage means 7 comprises a RAM, the operation of which is guaranteed at 4.5 V to 5.5 V, and the switching means 10a of the setting means 10 is closed.

Therefore, the potential appeared at the external power source potential node 6a is resistance-divided by the parallel resistance consisting of the resistor 61a of the potential generating means of the power source potential discriminating means 61, the resistor 61b of the potential generating means and the resistor 10b of the setting means 10 so that the divided potential appears at the connection node 61c of the potential generating means. The potential appeared at the connection node 61c and the reference potential (which is 1.35 V in this example) and the reference potential of the reference potential generating means 61e are subjected to a comparison by the comparison means 61d. As a result, a switching signal, which is the result of the comparison, is transmitted. The other operations are the same as those to be performed in the case where the rated power source potential of the terminal unit 1 of the system is 3 V.

Note that the potential appearing at the connection node 61c of the potential generating means is made to be 1.35 V when the potential appeared at the external power source potential node 6a is 4.5 V by setting the resistance values of the resistors 61a and 61b of the potential generating means and the resistor 10b of the setting means 10.

However, the conventional semiconductor integrated circuit 6 for controlling a power source has the following problems.

A first problem will now be described. Since the resistor 10b of the setting means 10 is, from outside, attached individually from the foregoing integrated circuit 6, the resistance value of the attached-type resistor 10b cannot easily accurately be maintained to correspond to the resistors 61a and 61b of the power source potential discriminating means 61. Furthermore, the attached-type resistor 10b causes the degree of integration of the memory card to be lowered.

A second problem arises as follows: since the power source switching means 62 has the structure in which only one transistor 62d is connected between the internal power source potential node 6b and the first backup power source 8, supply of a high level to the gate causes the transistor 62d to serve as a diode, the forward voltage of which is 0.6 V when the power source potential of the first backup power source 8 is 3.3 V because it has been just changed in a case where the power source potential of the terminal unit 1 of the system supplied to the internal power source potential node 6b is the lowest level of 2.7 V. As a result, an electric current flows from the first backup power source 8 to the internal power source potential node 6b through the transistor 62d. The flow leads to a fact that the life of the first backup power source 8 is shortened.

Since the bypass means 62f having only one diode device 62f1 is connected between the internal power source potential node 6b and the first backup power source 8, a similar problem arises.

A third problem will now be described. The alarm signal generating means 63 has a structure that the reference potential generating means 63a is operated with the power source potential of the terminal unit 1 of the system and is composed of the constant electric current source I2, the transistors Tr2 and Tr3 and the resistor R2 that are connected in series, as shown in FIG. 21. However, since the constant electric current source I2 encounters voltage drop of 0.5 V or more, it has been very difficult to generate the reference potential of 2.6 V from the power source potential of 3 V in a case where the power source potential of the terminal unit 1 of the system is the rated value of 3 V.

SUMMARY OF THE INVENTION

In order to overcome the foregoing problems, a first object of the present invention is to provide a semiconductor integrated circuit for controlling a power source in which attaching of a resistor for adapting to different rated values of the power source potential of a terminal unit of the system is eliminated but the same is, together with other resistors, disposed in the integrated circuit so that the resistance value of the resistor is enabled to be accurately obtained, and to provide a semiconductor integrated circuit for controlling a power source in which elimination of attaching the resistor improves the degree of integration in the memory card.

A second object of the present invention is to provide a semiconductor integrated circuit for controlling a power source having an arrangement that another transistor is connected between the internal power source potential node and the first backup power source so that flow of an electric current from the first backup power source to the internal power source potential node is prevented even the first backup power source has been just changed and therefore wasteful consumption of electric power of the first backup power source can be prevented and to provide a semiconductor integrated circuit for controlling a power source in which a bypass means having another diode device is connected between the internal power source potential node and the first backup power source so that the foregoing effect is obtained.

A third object of the present invention is to provide a semiconductor integrated circuit for controlling a power source in which the first backup power source is potential-divided so as to be supervised so that the reference potential is easily generated and therefore the power source potential of the first backup power source is accurately supervised.

A semiconductor integrated circuit for controlling a power source according to the present invention comprises: an external power source potential node to which an external power source potential is supplied; an internal power source potential node for transmitting an internal power source potential; a backup power source potential node to which a backup power source potential is supplied from a backup power source; a setting node to which a setting signal is supplied which indicates a first state where a rated value of the external power source potential to be supplied to the external power source potential node is a first potential or a second state where the rated value is a second potential; power source potential discriminating means which receives the external power source potential to be supplied to the external power source potential node and the setting signal to be supplied to the setting node, which obtains a first power source potential on the basis of the external power source potential if the setting signal indicates the first state to subject the first power source potential and a first reference potential to a comparison, which transmits a switching signal indicating use of the external power source potential to be supplied to the external power source potential node is the first power source potential is higher than the first reference potential or use of the backup power source potential to be supplied to the backup power source potential node if the first power source potential is lower than the first reference potential, which obtains a second power source potential on the basis of the external power source potential is the setting signal indicates the second state to subject the second power source potential and a second reference potential to a comparison, which transmits a switching signal indicating use of the external power source potential to be supplied to the external power source potential if the second power source potential is higher than the second reference potential or use of the backup power source potential to be supplied to the backup power source potential node if the second power source potential is lower than the second reference potential; and power source switching means which receives the switching signal from the power source potential discriminating means, which makes the external power source potential node and the internal power source potential node to be conductive if the switching signal indicates use of the external power source potential and which makes the backup power source potential node and the internal power source potential node to be conductive is the switching signal indicates use of the backup power source potential.

A semiconductor integrated circuit for controlling a power source according to the present invention has an arrangement that the power source switching means has switching means consisting of two transistor devices in series connected between the internal power source potential node and the backup power source potential node in such a manner that the two transistor devices have diode functions in opposite directions, and the two transistor devices respectively are made conductive or non-conductive in response to a switching signal from the power source potential discriminating means.

A semiconductor integrated circuit for controlling a power source according to the present invention further comprises alarm signal generating means having potential generating means for lowering the backup power source potential to be supplied to the backup power source potential node to transmit the lowered backup power source potential; and comparison means for subjecting the backup power source potential lowered by the potential generating means and a reference potential to a comparison to transmit an alarm signal if the lowered backup power source potential is lower than the reference potential.

DESCRIPTION OF THE PREFERRED EMBODIMENTS

First Embodiment

Figure 1:
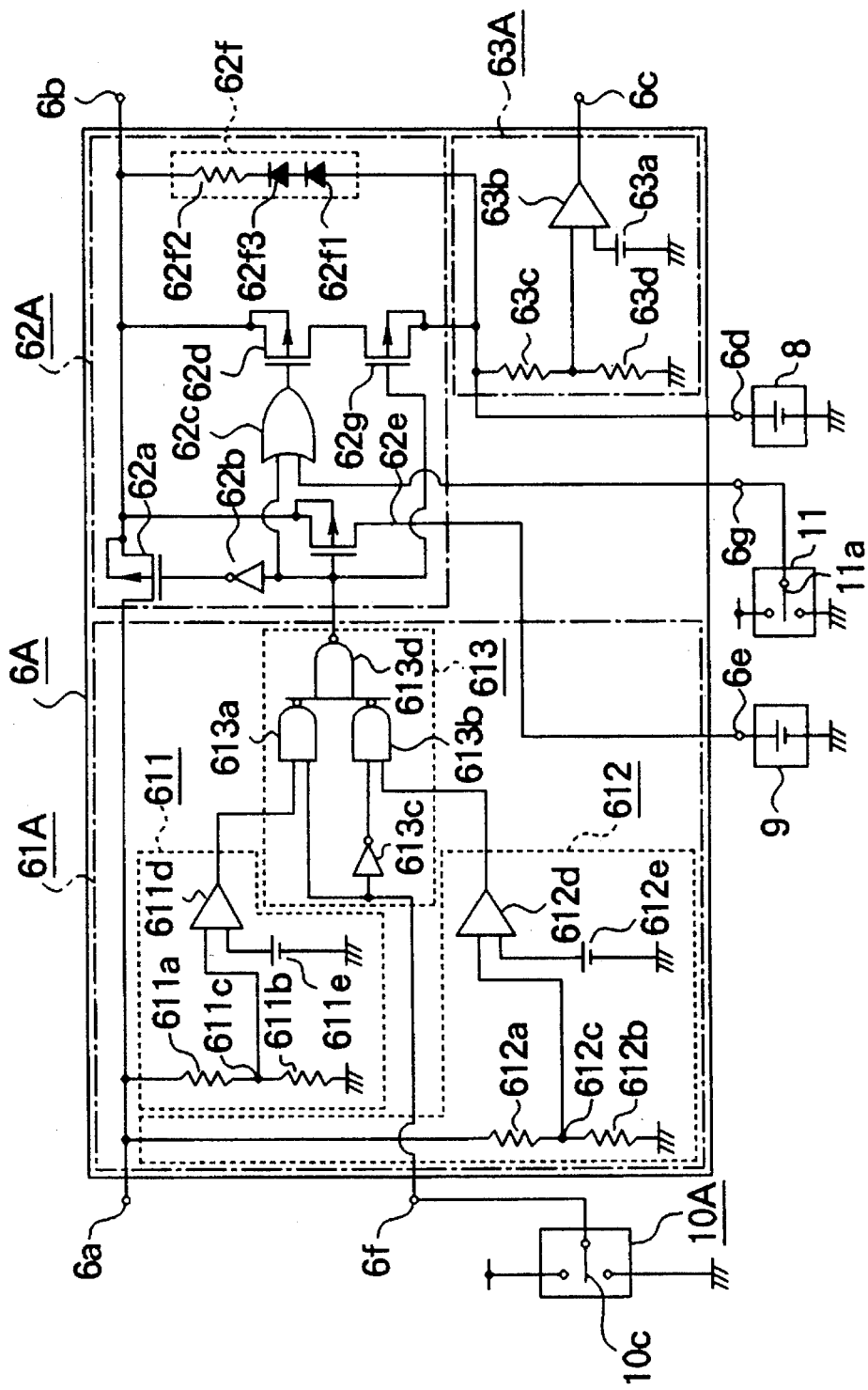
FIG. 1 is a circuit diagram which illustrates a semiconductor integrated circuit for controlling a power source according to a first embodiment of the present invention.
Figure 19:
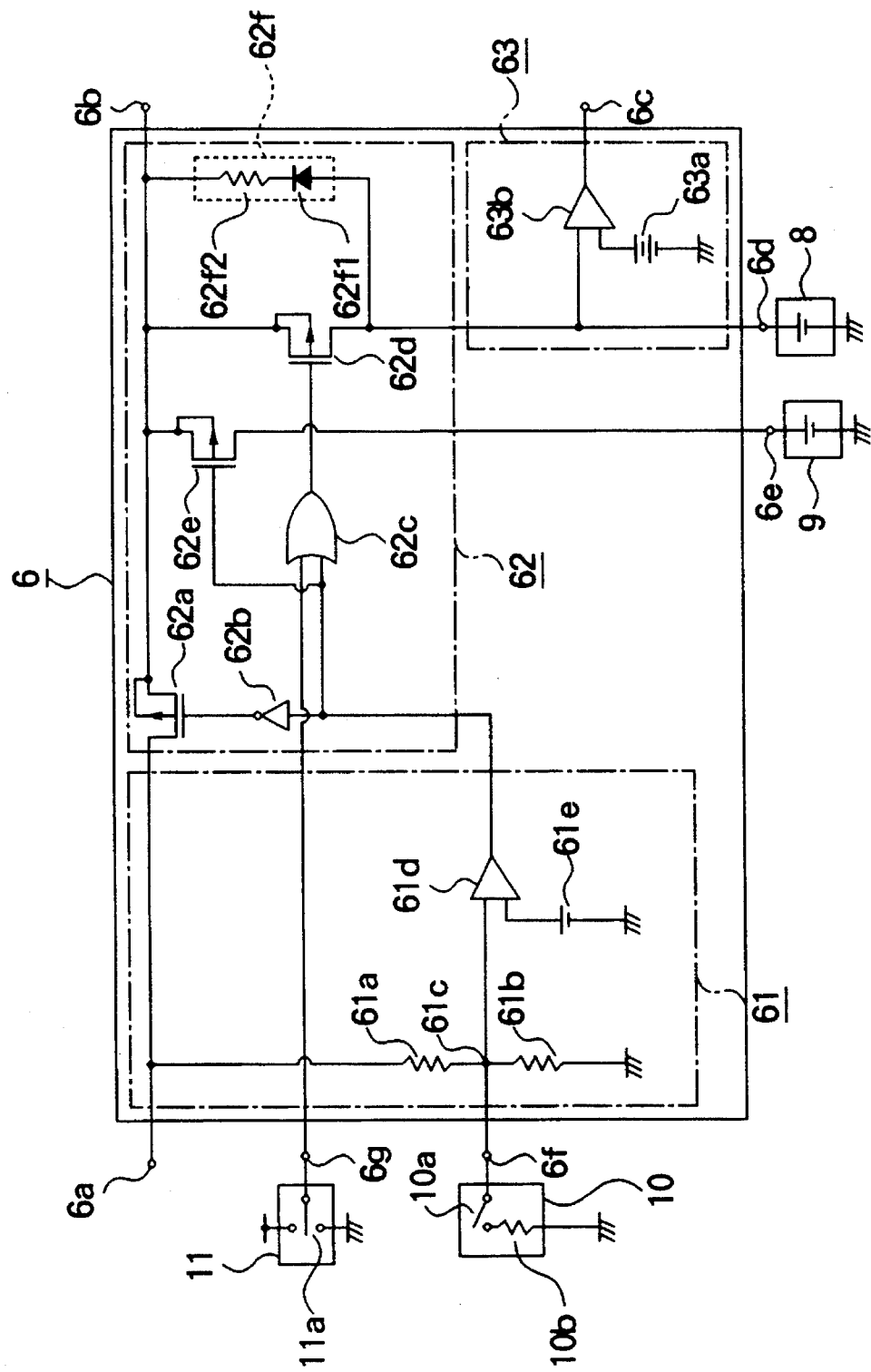
FIG. 19 is a circuit diagram which illustrates the structure of a conventional semiconductor integrated circuit for controlling a power source.

A first embodiment of the present invention will now be described with reference to FIG. 1. Referring to FIG. 1, the same reference numerals represent the same or equivalent elements as those shown in FIG. 19.

A setting means 10A acts to specify the memory card 2 to be adaptable to the rated power source potential, for example, 5 V and 3 V, supplied from the terminal unit 1 of the system. The setting means 10A sets the memory card 2 to be adaptable to the rated power source potential of the terminal unit 1 of the system when the semiconductor integrated circuit 6A for controlling a power source is mounted on the memory card 2. The setting means 10A transmits a setting signal consisting of a first state (a high-level potential in this embodiment) and a second state (a low-level portion in this example) to the setting node 6f. The setting means 10A is specifically composed of the switching means 10c for establishing the electric connection between the setting node 6f and the power source potential node (the internal power source potential node 6b in this embodiment) or the ground node.

The control means 11 specifies the memory card to correspond to a case where the backup power source to be mounted on the memory card has both first and second backup power sources 8 and 9 mounted thereon or a case where the same has either of the first and second backup power sources 8 and 9. When the semiconductor integrated circuit 6A for controlling a power source is mounted on the memory card, the control means 11 sets the memory card to be adaptable to the state where the backup power source is mounted.

The integrated circuit 6A comprises a power source potential discriminating circuit (means) 61A, a power source switching circuit (means) 62A and an alarm signal generating circuit (means) 63A.

The power source potential discriminating circuit 61A transmits a switching signal for determining whether the external power source potential to be supplied to the external power source potential node 6a is used or the first backup power source potential or/and the second backup power source potential to be supplied to the first backup power source potential node 6d or/and the second backup power source potential node 6e are used. That is, the power source potential discriminating circuit 61A detects whether or not the memory card is connected to the terminal unit 1 of the system and detects whether or not the power source potential to be supplied from the terminal unit 1 of the system is a rated value in a case where the memory card is connected to the terminal unit 1 of the system. If the memory card is not connected to the terminal unit 1 of the system or if the rated power source potential of the terminal unit 1 of the system is lower than the rated value, the power source potential discriminating circuit 61A transmits a switching signal for causing the backup power source to be used. If the power source potential of the terminal unit 1 of the system is the rated value, the power source potential discriminating circuit 61A transmits a switching signal for causing the power source potential of the terminal unit 1 of the system to be used.

The power source potential discriminating circuit 61A comprises a first power source potential discriminating portion 611, a second power source potential discriminating portion 612 and a switching signal output portion 613.

The first power source potential discriminating portion 611 is adapted to a case where the ratted power source potential of the terminal unit 1 of the system is 5 V and subjects the potential on the basis of the external power source potential to be supplied to the external power source potential node 6a and a first reference potential to a comparison. The first power source potential discriminating portion 611 transmits a first comparison result signal on the basis of the result of the comparison. The second power source potential discriminating portion 612 is adapted to a case where the rated power source potential of the terminal unit 1 of the system is 3 V and subjects the potential on the basis of the external power source potential to be supplied to the external power source potential node 6a and a second reference potential to a comparison. The second power source potential discriminating portion 612 transmits a second comparison result signal on the basis of the result of the comparison. The switching signal output portion 613 receives the first and second comparison result signals from the first and second power source potential discriminating portions and 612. Furthermore, the switching signal output portion 613 receives a setting signal supplied to the setting node 6f thereof and selects either the first or the second comparison result signal in accordance with the state of the setting signal to transmit the selected comparison result signal as a switching signal.

The first power source potential discriminating portion 611 is in series connected between the external power source potential node 6a and the ground potential node and comprises a first potential generating means, a first reference potential generating means 611e and a first comparison means 611d.

The first potential generating means comprises first and second resistors 611a and 611b for transmitting, to a first connection node 611c, the potential on the basis of the power source potential supplied to the external power source potential node 6a. The first reference potential generating means 611e transmits a first reference potential.

The first comparison means 611d is operated with the power source potential of the terminal unit 1 of the system supplied to the external power source potential node 6a through the power source potential supply line 3. The first comparison means 611d has an input terminal connected to the first connection node 611c and another input node that receives the first reference potential from the first reference potential generating means 611e. The first comparison means 611d transmits a first comparison result signal upon which the external power source potential is used if the power source potential appeared at the connection node 611c is higher than the reference potential of the first reference potential generating means 611e or upon which the backup power source potential is used if the potential appeared at the connection node 611c is lower than the first reference potential. The first comparison means 611d is brought to a high level if the potential appeared at the first connection node 611c is higher than the first reference potential, and the level of which is lowered if the potential appeared at the first connection node 611c is lower than the first reference potential.

Figure 20:
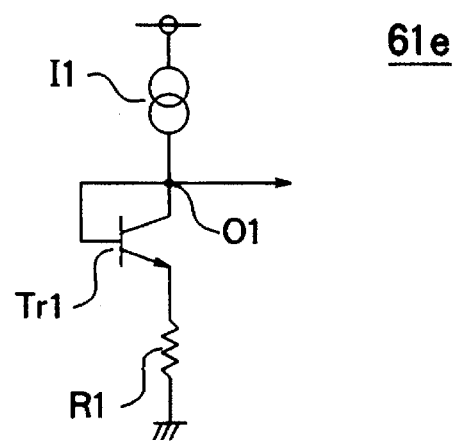
FIG. 20 is a circuit diagram which illustrates a reference potential generating circuit of the power source potential discriminating circuit shown in FIG. 19.

The first reference potential generating means 611e, as shown in FIG. 20, comprises the constant electric current source I1 connected between the power source potential node (which is the external power source potential node 6a in this embodiment) and the output node 01 (Output 1), the npn bipolar transistor Tr1, the collector and the base of which are connected to the output node 01 and which serves as a diode device, and the resistor R1 connected between the emitter of the transistor Tr1 and the ground node. The first reference potential generating means 611e has a small number of circuit devices and as well as causes the reference potential appearing at the output node 01 to be stable against change (even if it is 5 V or 3 V) in the power source potential to be supplied to the power source potential node and the temperature.

Specific examples of the resistors 611a and 611b of the first potential generating means of the first power source potential discriminating portion 611 and the first reference potential generating means 611e are as follows.

That is, the first reference potential generating means 611e is caused to generate a first reference potential of 1.35 V by determining the circuit constants of the constant electric current source I1, the transistor Tr1 and the resistor R1. The resistors 611a and 611b of the first potential generating means are set such that a voltage level of 1.35 V appears at the connection node 611c when the power source potential of the terminal unit 1 of the system supplied to the external power source potential node 6a is 4.5 V in a case where the storage means 7, the operation of which is guaranteed in a power source potential range from 4.5 V to 5.5 V, is used to be adaptable to the case where the rated power source potential of the terminal unit 1 of the system is 5 V. The resistance value of the resistor 611a is, for example, 600 kΩ and that of the resistor 611b is, for example, 260 kΩ.

The second power source potential discriminating portion 612 is in series connected between the external power source potential node 6a and the ground potential node and comprises a second potential generating means, a second reference potential generating means 612e and a second comparison means 612d.

The second potential generating means comprises first and second resistors 612a and 612b for transmitting, to a connection node 612c, potentials on the basis of the power source potential supplied to the external power source potential node 6a. The second reference potential generating means 612e transmits a second reference potential. The second comparison means 612d is operated with the power source potential supplied from the terminal unit 1 of the system through the power source potential supply line 3 and has an input terminal connected to the connection node 612c and another input node that receives the second reference potential from the second reference potential generating means 612e. The second comparison means 612d transmits a second comparison result signal upon which use of the external power source potential is instructed if the potential appeared at the connection node 612c is higher than the reference potential of the second reference potential generating means 612e and use of the backup power source potential is instructed if the potential appeared at the connection node 612c is lower than the second reference potential. In this embodiment, the second comparison means 612d transmits the second comparison result signal, the level of which is made to be high if the potential appeared at the connection node 612c is higher than the second reference potential and the level of which is lowered if the potential appeared at the connection node 612c is lower than the second reference potential.

The second reference potential generating means 612e has a structure shown in FIG. 20 which is similar to that of the first reference potential generating means 611e. The second reference potential generating means 612e may be provided individually from the first reference potential generating means 611e or may also serve as the first reference potential generating means 611e.

The specific examples of the resistors 612a and 612b of the second potential generating means and the second reference potential generating means 612e of the second power source potential discriminating portion 612 are structured as follows.

That is, the second reference potential generating means 612e is so structured as to generate a second reference potential of 1.35 V by determining the circuit constants of the constant electric current source I1, the transistor Tr1 and the resistor R1. The resistors 612a and 612b of the second potential generating means have the same resistance value in order to cause a voltage level of 1.35 V to appear at the connection node 612c when the power source potential from the terminal unit 1 of the system supplied from the external power source potential node 6a is 2.7 V in a case where the storage means 7, the operation of which is guaranteed in a power source potential range from 2.7 V to 3.3 V to be adaptable to the case where the rated power source potential of the terminal unit 1 of the system is 3 V, is used. The resistance value of the resistors 612a and 612b of the potential generating means is, for example, 600 kΩ.

The switching signal output portion 613 comprises a first logical operation means 613a, a second logical operation means 613b and a third logical operation means 613d.

The first logical operation means 613a receives a first comparison result signal from the first power source potential discriminating portion 611 at an input node thereof and receives a setting signal supplied to the setting node 6f at another input node thereof. The second logical operation means 613b receives, at an input node thereof, a second comparison result signal from the second power source potential discriminating portion 612 and receives, at another input node thereof and through an invertor means 613c, a setting signal supplied to the setting node 6f. The third logical operation means 613d receives, at an input node thereof, the output from the first logical operation means 613a and receives, at another input node thereof, the output from the second logical operation means 613b so as to transmit the outputs as switching signals. Note that the first logical operation means 613a, the second logical operation means 613b, the third logical operation means 613d and the invertor means 613c are operated on the basis of the power source potential of the terminal unit 1 of the system supplied through the power source potential supply line 3.

The first logical operation means 613a comprises, for example, a NAND circuit having a structure that when the setting signal supplied to the setting node 6f thereof is in a first state (which is, in this embodiment, a state where the switching means 10c is connected to the power source potential node so that it transmits a high-level potential) indicating that the rated power source potential of the terminal unit 1 of the system is 5 V, then the first logical operation means 613a receives the first state at another input node thereof so as to transmit a signal on the basis of the first comparison result signal supplied from the first power source potential discriminating portion 611 and received at an input node thereof.

The first logical operation means 613a has a structure that when the setting signal supplied to the setting node 6f thereof is in a second state (which is, in this embodiment, a state where the switching means 10c is connected to the ground potential node so that it transmits a low-level potential) indicating that the rated power source potential of the terminal unit 1 of the system is 3 V, then the first logical operation means 613a receives the second state at another input node thereof so as to transmit a predetermined potential, which is a high-level potential in this embodiment, regardless of the first comparison result signal supplied from the first power source potential discriminating portion 611 and received at an input node thereof.

The second logical operation means 613b comprises, for example, a NAND circuit and has a structure that, when the setting signal supplied to the setting node 6f thereof is in the first state, the second logical operation means 613b receives, at another input node thereof, a state (which is a low-level potential in this embodiment), which is inversion of the first state, through the invertor means 613c so as to transmit a predetermined potential, which is a high-level potential in this embodiment, regardless of the second comparison result signal supplied from the second power source potential discriminating portion 612 and received at an input node thereof. The second logical operation means 613b has a structure that, when the setting signal supplied to the setting node 6f thereof is in the second state, the second logical operation means 613b receives, at the other input node thereof, a state (which is a high-level potential in this embodiment), which is inversion of the second state, through the invertor means 613c so as to transmit a signal on the basis of the first comparison result signal supplied from the second power source potential discriminating portion 612 and received at one input node thereof.

The third logical operation means 613d comprises, for example, a NAND circuit and has a structure that, when the third logical operation means 613d receives the predetermined potential from the first logical operation means 613a at an input node thereof, the third logical operation means 613d transmits a switching signal composed of the signal on the basis of the second comparison result signal supplied from the second power source potential discriminating portion 612 is the signal on the basis of the output from the second logical operation means 613b received at another input node thereof, that is, the setting signal supplied to the setting node 6f, is in the second state. The third logical operation means 613d has a structure that, when the third logical operation means 613d receives the predetermined potential from the second logical operation means 613b at another input node thereof, the third logical operation means 613d transmits a switching signal composed of the signal on the basis of the first comparison result signal supplied from the first power source potential discriminating portion 611 is the signal on the basis of the output from the first logical operation means 613a received at the input node thereof, that is, the setting signal supplied to the setting node 6f, is in the first state.

The power source switching circuit 62A receives the power source potential from the terminal unit 1 of the system supplied to the external power source potential node 6a thereof and receives power source potentials from the first and second backup power sources 8 and 9. The power source switching circuit 62A further receives the switching signal from the power source potential discriminating circuit 61A and the control signal from the control means and selects the power source potential of the terminal unit of the system or the power source potentials of the first and second backup power sources 8 and 9 in response to the foregoing switching signal to transmit the selected power source potential to the internal power source potential node 6b.

The power source switching circuit 62A comprises inversion circuit) 62b, a logical operation means 62c, a switching means 62d, a switching means 62e, a bypass means 62f and a switching means 62g.

The switching means 62a comprises a P-channel MOS transistor 62a connected between the external power source potential node 6a and the internal power source potential node 6b and has a backgate connected to the internal power source potential node 6b, conduction of the P-channel MOS transistor 62a being controlled in response to the switching signal from the power source potential discriminating circuit 61A.

The invertor means 62b is operated with the power source potentials from the first and second backup power sources 8 and 9, receives the switching signal from the power source potential discriminating means 61A and has an output node connected to the transistor 62a.

The logical operation means 62c is operated with the power source potentials from the first and second backup power sources 8 and 9, receives the switching signal at an input node thereof, has another input node connected to the control node 6g and transmits a control signal instructing whether or not the first backup power source 8 is connected to the internal power source potential node 6b.

The switching means 62d comprises a P-channel MOS transistor 62d having either main electrode and a back gate which are connected to the internal power source potential node 6b and having a gate electrode that receives the control signal from the logical operation means 62c, conduction of the P-channel MOS transistor 62d being controlled in response to the foregoing control signal.

The switching means 62e comprises a P-channel MOS transistor 62e connected between the second backup power source potential node 6e and the internal power source potential node 6b, has a backgate connected to the internal power source potential node 6b and has a gate electrode that receives the foregoing switching signal, conduction of the P-channel MOS transistor 62e being controlled in response to the switching signal.

The bypass means 62f comprises the diode devices 62f1 and 62f3 and the resistor 62f2 in series connected between the first backup power source potential node 6d and the internal power source potential node 6b. The anode electrode of the diode device 62f1 is connected to the first backup power source potential node 6d.

The switching means 62g comprises a P-channel MOS transistor 62g connected between another main electrode of the transistor 62d and the first backup power source potential node 6d, has a backgate connected to the first backup power source potential node 6d and has a gate electrode which receives the foregoing switching signal, conduction of the P-channel MOS transistor 62g being controlled in response to the switching signal.

The logical operation means 62c comprises, for example, an OR circuit and has a structure such that, when a high-level potential is supplied to the control node 6g thereof (when the first and second backup power sources 8 and 9 are used or when only the second backup power source 9 is used), the logical operation means 62c transmits a control signal, the level of which is high regardless of the level of the switching signal from the power source potential discriminating circuit 61A. When a low-level potential is supplied to the control node 6g (when only the first backup power source 8 is used), the logical operation means 62c transmits a control signal, the level of which is high if the level of the switching signal from the power source potential discriminating circuit 61A is high. If the switching signal from the power source potential discriminating circuit 61A is low, the logical operation means 62c transmits a control signal, the level of which is low.

The transistor 62d is made conductive when its gate electrode receives a low-level potential and serves as a diode device (the forward voltage (the threshold) is 0.6 V in this embodiment), the forward direction of which is arranged from the first backup power source potential node 6d to the internal power source potential node 6b when a high-level potential is received because the backgate of the transistor 62d is connected to the internal power source potential node 6b.

The transistor 62e is made conductive when a low-level potential is received at the gate electrode thereof and serves as a diode device (the forward voltage (the threshold) is 0.6 V in this embodiment), the forward direction of which is arranged from the second backup power source potential node 6e to the internal power source potential node 6b when a high-level potential is received because the backgate of the transistor 62e is connected to the internal power source potential node 6b.

The transistor 62g is made conductive when a low-level potential is received at the gate electrode thereof and serves as a diode device (the forward voltage (the threshold) is 0.6 V in this embodiment), the forward direction of which is arranged from the internal power source potential node 6b to the first backup power source potential node 6d when a high-level potential is received because the backgate of the transistor 62e is connected to the first backup power source potential node 6d.

The control means 11, in this embodiment, comprises a switching means 11a for establishing the electrical connection between the control node 6g and the power source potential node (which is the internal power source potential node 6b in this embodiment) or the ground node.

The alarm signal generating circuit 63A discriminates whether or not the power source potential of the first backup power source 8 is higher than a potential (about 2 V) sufficiently high for the storage means 7 to store data. If the power source potential of the first backup power source 8 is lower than the predetermined potential, the alarm signal generating circuit 63A transmits, to the terminal unit 1 of the system, an alarm signal for urging change of the first backup power source 8 through the alarm signal line 5.

The alarm signal generating circuit 63A comprises a reference potential generating means 63a, a comparison means 63b and a potential generating means.

The reference potential generating means 63a generates a reference potential. The comparison means 63b is operated with the power source potential of the terminal unit 1 of the system and has another input node that receives the reference potential and an output node connected to the alarm signal output node 6c. The potential generating means comprises resisters 63c and 63d in series connected between the first backup power source potential node 6d and the ground node such that the connection points are connected to one node of the comparison means 63b so as to supply, to either input node of the comparison means 63b, a potential according to the first backup power source potential supplied to the first backup power source potential node 6d.

Figure 21:
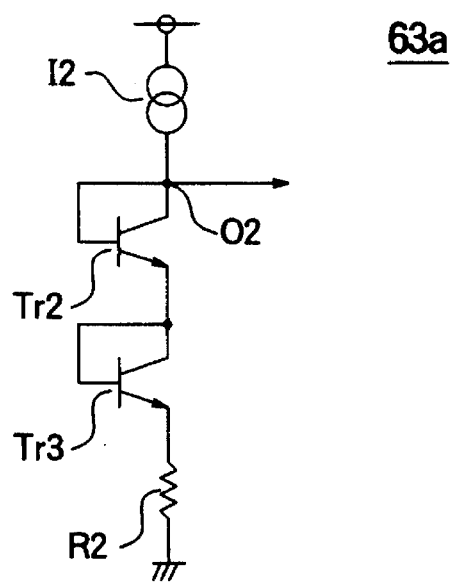
FIG. 21 is a circuit diagram which illustrates a reference potential generating circuit of the alarm signal generating circuit shown in FIG. 19.

The reference potential generating means 63a, as shown in FIG. 21, comprises a constant electric current source I2 connected between the power source potential node (which is the external power source potential node 6a in this embodiment) and the output node 02 (Output2), a npn bipolar transistor Tr2, the collector and the base of which are connected to the output node 02 and which serves as a diode device, an npn bipolar transistor Tr3, the emitter and the collector of which are connected to the emitter of the transistor Tr2 and which serves as a diode device and a resistor R2 connected between the emitter of the transistor Tr3 and the ground node.

The reference potential generating means 63a has a small number of circuit devices and causes the reference potential appearing at the output node 02 to be made stable against change in the power source potential (for example, if it is 5 V or 3 V) to be supplied to the power source potential node and temperature.

A specific example of the reference potential generating means 63a is structured such that the circuit constants of the constant electric current source I2, the transistors Tr2 and Tr3 and the resistor R2 are determined in order to generate a reference potential of, for example, 1.3 V.

Each of the resistors 63c and 63d constituting the potential generating means specifically has a resistance value of 600 kΩ in order to make the potential of the connection point between the resister 63c and 63d to be lower than 1.3 V and to cause the comparison means 63b to transmit the alarm signal when the first backup power source potential supplied to the first backup power source potential node 6d is lower than, for example, 2.6 V.

The operation of the semiconductor integrated circuit 6A for controlling a power source structured as described above will now be described.

First, the memory card 2 will now be described which is adapted to a rated power source potential of the terminal unit 1 of the system of 3 V and which has both first and second backup power sources 8 and 9 mounted thereon.

In this case, the storage means 7 comprises the RAM, the operation of which is guaranteed from 2.7 V to 3.3 V, the switching means 10c of the setting means 10A is brought into a state where the setting node 6f is connected to the ground potential node to transmit a low-level potential (the second state) and the switching means 11a of the control means 11 establishes the electric connection between the internal power source potential node 6b and the control node 6g.

When the memory card 2 is connected to the terminal unit 1 of the system in the foregoing state, the power source potential is supplied to the external power source potential node 6a from the terminal unit 1 of the system through the power source potential supply line 3.

As a result, in the first power source potential discriminating portion 611, a potential on the basis of the power source potential of the terminal unit 1 of the system appeared at the external power source potential node 6a, that is, a potential divided by the resistors 611a and 611b of the first potential generating means, appears at the first connection node 611c of the first potential generating means. The potential at the first connection node 611c and the first reference potential (1.35 V in this embodiment) of the first reference potential generating means 611e are subjected to a comparison by the first comparison means 611d. The first comparison means 611d transmits a high-level comparison result signal indicating use of the power source potential of the terminal unit 1 of the system as the internal power source potential if the potential of the first connection node 611c is higher than the first reference potential.

In the second power source potential discriminating portion 612, a potential on the basis of the power source potential of the terminal unit 1 of the system appeared at the external power source potential node 6a, that is, the potential divided by the resistors 612a and 612b of the second potential generating means, appears at the connection node 612c of the second potential generating means. The potential of the connection node 612c and the second reference potential (1.35 V in this embodiment) of the second reference potential generating means 612e are subjected to a comparison by the second comparison means 612d. The second comparison means 612d transmits a high-level comparison result signal indicating use of the power source potential of the terminal unit 1 of the system as the internal power source potential if the potential of the connection node 612c is higher than the second reference potential.

The switching signal output portion 613 receives the first and second comparison result signals and the low-level potential (the second state) of the setting means 10A and transmits a switching signal corresponding to the second comparison result signal of the second power source potential discriminating portion 612 when the setting node 6f has been made low level. Since the power source potential of the terminal unit 1 of the system is 3 V and the potential appearing at the connection node 612c of the second power source potential discriminating portion 612 is higher than the second reference potential in the foregoing case, a high-level second comparison result signal is transmitted. Therefore, the switching signal output portion 613 transmits a high-level switching signal.

The high-level switching signal is inverted by the invertor means 62b of the power source switching circuit 62A so that a low-level potential is supplied to the transistor 62a. The transistor 62a, which has received the low-level potential at the gate electrode thereof, is made conductive. Therefore, the power source potential of the terminal unit 1 of the system appeared at the external power source potential node 6a appears at the internal power source potential node 6b through the transistor 62a. Thus, the power source potential of the terminal unit 1 of the system is supplied to the internal circuit of the memory card 2 including the storage means 7.

The memory card 2, which is operated with the power source potential of the terminal unit 1 of the system, performs data writing on the terminal unit 1 of the system and performs reading of data from the terminal unit 1 of the system.

The high-level switching signal is also supplied to the gate electrode of the transistor 62e of the power source switching circuit 62A. Thus, the transistor function of the transistor 62e is made non-conductive.

Therefore, supply of the power source potential from the second backup power source 9 to the internal power source potential node 6b does not take place so far as the potential of the internal power source potential node 6b is higher than a value obtained by subtracting the threshold for the transistor 62e to serve as a diode device from the power source potential of the second backup power source 9. Since the second comparison means 612d discriminates that the power source potential of the terminal unit 1 of the system is, at present, 2.7 V or higher and the power source potential of the terminal unit 1 of the system is supplied to the internal power source potential node 6b, the power source potential of the internal power source potential node 6b is 2.7 V or higher. Therefore, supply of the power source potential from the second backup power source 9 to the internal power source potential node 6b does not take place.

Since a high-level control signal is supplied from the control means 11 to one of the input nodes of the logical operation means 62c of the power source switching circuit 62A through the control node 6g, a high-level control signal is transmitted from the logical operation means 62c regardless of the level of the foregoing switching signal. The high-level control signal is supplied to the gate electrode of the transistor 62d so that the transistor function of the transistor 62d is made non-conductive.

The high-level switching signal is also supplied to the gate electrode of the transistor 62g of the power source switching circuit 62A so that the-transistor function of the transistor 62g is made non-conductive.

Therefore, supply of the power source potential from the first backup power source 8 to the internal power source potential node 6b through the transistors 62d and 62g does not take place. Furthermore, since the power source potential of the internal power source potential node 6b is higher than the value obtained by subtracting a total value of the thresholds of the diodes 62f1 and 62f3 from the first backup power source 8, supply of power source potential from the first backup power source 8 to the internal power source potential node 6b through the bypass means 62f does not take place.

The comparison means 63b of the alarm signal generating circuit 63A subjects, to a comparison, the potential corresponding to the power source potential of the first backup power source 8, that is, the potential divided by the resistors 63c and 63d of the potential generating means and appeared at their connection point, and the reference potential (1.3 V in this embodiment) of the reference potential generating means 63a. If the power source potential of the first backup power source 8 is lower than the foregoing reference potential, the comparison means 63b transmits an alarm signal for instructing change of the first backup power source 8 to the terminal unit 1 of the system through the alarm signal line 5.

Since the potential corresponding to the power source potential of the first backup power source 8 divided by the resistors 63c and 63d of the potential generating means is supplied to the comparison means 63b, the reference potential for use in the comparison means 63b can be lowered. Therefore, the reference potential generating means 63a, which generates the foregoing reference potential using the power source potential of the terminal unit 1 of the system, that is 3 V in this embodiment, is able to accurately transmit the reference potential (1.3 V in this embodiment).

If the power source potential of the terminal unit of the system is made lower than 2.7 V due to some reason during use in the foregoing state, the potential of the connection node 612c of the second potential generating means of the second power source potential discriminating portion 612 is made lower than the second reference potential (1.35 V in this embodiment). As a result, a low-level second comparison result signal is transmitted from the second power source potential discriminating portion 612. The switching signal output portion 613, which has received the second comparison result signal, transmits a low-level switching signal indicating that the power source potential of the backup power source is used as the internal power source potential.

The low-level switching signal is inverted by the invertor means 62b of the power source switching circuit 62A so that it is supplied to the transistor 62a as a high level potential. The transistor function of the transistor 62a, which has received the high-level potential at the gate electrode thereof, is made non-conductive. Since the power source potential of the terminal unit 1 of the system is lower than 2.7 V at this time, data transfer between the memory card 2 and the terminal unit 1 of the system is inhibited.

The low-level switching signal is also supplied to the gate electrode of the transistor 62e of the power source switching circuit 62A so that the transistor 62e made conductive.

As a result, the second backup power source 9 and the internal power source potential node 6b are made electrically conductive. It leads to a fact that supply of the power source potential from the second backup power source 9 to the internal power source potential node 6b is enabled. Therefore, the power source potential of the internal power source potential node 6b is supplied from the second backup power source 9.

That is, the power source potential is supplied to the storage means 7 from the second backup power source 9. Therefore, a problem of loss of data stored in the storage means 7 can be prevented.

Since the transistor 62d of the power source switching circuit 62A has received the high-level control signal from the logical operation means 62c, the transistor function of the transistor 62d is made non-conductive. On the other hand, the transistor 62g has received the low-level switching signal at the gate electrode thereof and thus it has been made conductive. However, supply of the power source potential from the first backup power source 8 to the internal power source potential node 6b does not take place so far as the power source potential of the internal power source potential node 6b is higher than the value obtained by subtracting the threshold for the transistor 62d to serve as a diode from the first backup power source 8.

When the supply of the power source potential to the internal power source potential node 6b is switched from the terminal unit 1 of the system to the second backup power source 9, scatter of the circuit devices taking place during manufacturing sometimes causes the transistor 62e to be brought to a conductive state after the transistor 62a has been brought to a non-conductive state.

However, since the structure of this embodiment is arranged such that the transistor 62e serves as a diode device, the power source potential is supplied from the second backup power source 9 to the internal power source potential node 6b when the potential of the internal power source potential node 6b is made lower than the potential obtained by subtracting the threshold for the transistor 62e to serve as the diode device from the power source potential of the second backup power source 9. As a result, the potential of the internal power source potential node 6b cannot be made lower than a certain value. Therefore, the problem of loss of data stored in the storage means 7 can be prevented.

Since the structure is so arranged that the transistor 62d similarly serves as the diode device and the bypass means 62f is provided, the power source potential is supplied from the first backup power source 8 to the internal power source potential node 6b when the potential of the internal power source potential node 6b is made lower than the potential obtained by subtracting the threshold for the transistor 62d to serve as a diode device or subtracting the thresholds of the diode devices 62f1 and 62f3 of the bypass means 62f from the power source potential of the first backup power source 8. As a result, the potential of the internal power source potential node 6b cannot be made lower than a certain value. Therefore, the problem of loss of data stored in the storage means 7 can be prevented.

The operation of the foregoing integrated circuit 6A adaptable to the memory card 2B having only the second backup power source 9 will now be described.

Also in this case, the operation is performed similarly to that of the foregoing integrated circuit 6A adaptable to the memory card 2 having the first and second backup power sources 8 and 9 mounted thereon.

Since the first backup power source 8 is omitted from the structure, supply of the power source potential from the first backup power source 8 to the internal power source potential node 6b does not take place but the power source potential is supplied from the second backup power source 9 in a case where scatter of the circuit devices taking place during manufacturing sometimes causes the transistor 62e to be brought to a conductive state after the transistor 62a has been brought to a non-conductive state when the supply of the power source potential to the internal power source potential node 6b is switched from the terminal unit 1 of the system to the second backup power source 9. Therefore, any problem is not raised.

The operation of the foregoing integrated circuit 6A adaptable to the memory card 2A having only the first backup power source 8 mounted thereon will now be described.

In the foregoing case, the switching means 11a of the control means 11 establishes the electrical connection between the ground potential node and the control node 6g as contrasted with the foregoing integrated circuit 6A adaptable to the memory card 2 having the first and second backup power sources 8 and 9 mounted thereon.

Therefore, a low-level control signal is supplied to either of the logical operation means 62c from the control means 11 through the control node 6g. As a result, the logical operation means 62c transmits a control signal, the level of which corresponds to the level of the switching signal.

In a case where the power source potential of the terminal unit 1 of the system is high and therefore the power source potential is supplied to the internal power source potential node 6b, a high-level switching signal is transmitted from the power source potential discriminating circuit 61A. The transistor 62a, which has received the low-level potential at the gate electrode thereof through the invertor means 62b of the power source switching circuit 62A, is made conductive. As a result, the memory card 2A, the switching means 62a, an invertor means (an which is operated with the power source potential of the terminal unit 1 of the system, performs writing of data from the terminal unit 1 of the system or reading of data to the terminal unit 1 of the system.

On the other hand, the logical operation means 62c of the power source switching means 62A, which receives the high-level switching signal at another input node thereof, transmits a high-level output. The transistor function of the transistor 62d, which receives the high-level control signal at the gate electrode thereof, is made non-conductive. The transistor function of the transistor 62g, which receives the high-level switching signal at the gate electrode thereof, is made non-conductive. Therefore, supply of the power source potential from the first backup power source 8 to the internal power source potential node 6b through the transistors 62d and 62g does not take place in this case. Furthermore, supply of the power source potential to the internal power source potential node 6b through the bypass means 62f takes place only when the internal power source potential of the internal power source potential node 6b is lower than the power source potential of the first backup power source 8 by a predetermined value.

If the power source potential of the terminal unit 1 of the system has been lowered due to some reason and therefore a low-level switching signal has been transmitted from the power source potential discriminating circuit 61A, the transistor function of the transistor 62a, which has received the high-level potential at the gate electrode thereof through the invertor means 62b of the power source switching circuit 62A, is made non-conductive. Since the power source potential of the terminal unit 1 of the system is lower than 2.7 V at this time, data transfer between the memory card 2A and the terminal unit 1 of the system is inhibited.

On the other hand, the logical operation means 62c, which receives the low-level switching signal at the input node thereof, transmits a low-level control signal. The transistor function of the transistor 62d, which receives the low-level control signal at the gate electrode thereof, is made conductive. Also the transistor function of the transistor 62g, which receives the low-level switching signal at the gate electrode thereof, is made conductive.

Hence, the first backup power source 8 and the internal power source potential node 6b are made electrically conductive. Therefore, the supply of the power source potential is enabled from the first backup power source 8 to the internal power source potential node 6b. Thus, the power source potential for the internal power source potential node 6b is supplied from the first backup power source 8.

That is, the storage means 7 is supplied with the power source potential from the first backup power source 8. Therefore, the problem of loss of data stored in the storage means 7 can be prevented.

If scatter of the circuit devices taking place during manufacturing causes the transistors 62d and 62g to be conductive after the transistor 62a has been made non-conductive in a case where supply of the power source potential to the internal power source potential node 6b is switched from the terminal unit 1 of the system to the first backup power source 8, the provided bypass means 62f causes the power source potential to be supplied from the first backup power source 8 to the internal power source potential node 6b when the potential of the internal power source potential node 6b is made lower than the potential obtained by subtracting the thresholds of the diode devices 62f1 and 62f3 of the bypass means 62f from the power source potential of the first backup power source 8. Therefore, the potential of the internal power source potential node 6b cannot be made lower than a certain value. Therefore, the problem of loss of data stored in the storage means 7 can be prevented.

The comparison means 63b of the alarm signal generating circuit 63A subjects, to a comparison, the potential of the connection point divided by the resistors 63c and 63d constituting the potential generating means on the basis of the power source potential of the first backup power source 8 and the reference potential (1.3 V in this embodiment) of the reference potential generating means 63a. If the potential on the basis of the power source potential of the first backup power source 8 is lower than the foregoing reference potential, the comparison means 63b transmits an alarm signal instructing change of the first backup power source 8 to the terminal unit 1 of the system through the alarm signal line 5.

Then, the operation of the foregoing integrated circuit 6 adaptable to the memory card 2 adapted to the rated power source potential of the terminal unit 1 of the system of 3 V and having the first and second backup power sources 8 and 9 mounted thereon to be performed in a case where the memory card 2 has been removed from the terminal unit 1 of the system will now be described.

Since the comparison means 613d of the switching signal output portion 613 of the power source potential discriminating circuit 61A is operated by the terminal unit of the system, the comparison means 613d transmits a low-level output if the memory card 2 is separated from the terminal unit 1 of the system.

Since the invertor means 62b of the power source switching circuit 62A is operated with the backup power source, it receives a low-level potential from the comparison means 613d to supply a high-level potential to the gate electrode of the transistor 62a to make the transistor function of the transistor 62a to be non-conductive.

The transistor 62e, which receives the low level at the gate electrode thereof from the power source potential discriminating circuit 61A, is made conductive. Thus, the power source potential of the second backup power source 9 is supplied to the internal power source potential node 6b through the transistor 62e.

Since the control means 11 has the structure to receive the power source potential from the internal power source, the control means 11 transmits a high-level output even if the memory card 2 is separated from the terminal unit 1 of the system. Therefore, the logical operation means 62c, which is operated with the backup power source, receives the high level from the control means 11 and the low level from the power source potential discriminating circuit 61A to supply a high-level potential to the gate electrode of the transistor 62d so as to make the transistor function of the transistor 62d to be non-conductive. The transistor 629 is made conductive when it receives the low level at the gate electrode thereof. As a result, the power source potential of the first backup power source 8 is not supplied to the internal power source potential node 6b.

In short, in a case where the memory card 2 has been removed from the terminal unit 1 of the system, the power source potential from the second backup power source 9 is supplied to the internal power source potential node 6b. Therefore, the problem of loss of data stored in the storage means 7 can be prevented.

Note that the comparison means 63b of the alarm signal generating circuit 63A has the structure to receive the power source potential of the terminal unit 1 of the system and therefore the comparison means 63b does not transmit the alarm signal.

The operation of the foregoing integrated circuit 6A adaptable to a memory card which is adapted to the rated power source potential of the terminal unit 1 of the system of 5 V will now be described.

In this case, the storage means 7 comprises a RAM, the operation of which is guaranteed at 4.5 V to 5.5 V and the switching means 10c of the setting means 10A is brought to a state where the setting node 6f is connected to the power source potential node to transmit a high level (the first state).

As a result, in the first power source potential discriminating portion 611, the potential on the basis of the power source potential from the terminal unit 1 of the system, that is, the potential divided by the resistors and 611b of the first potential generating means, appears at the first connection node 611c. The potential of the first connection node 611c and the first reference potential (1.35 V in this embodiment) are subjected to a comparison by the first comparison means 611d. If the potential of the first connection node 611c is higher than the first reference potential, a high-level first comparison result signal indicating that the power source potential of the terminal unit 1 of the system is used as the internal power source potential is transmitted from the first comparison means 611d.

In the second power source potential discriminating portion 612, the potential on the basis of the power source potential from the terminal unit 1 of the system, that is, the potential divided by the resistors 612a and 612b of the second potential generating means, appears at the connection node 612c. The potential of the connection node 612c and the second reference potential (1.35 V in this embodiment) are subjected to a comparison by the second comparison means 612d. If the potential of the connection node 612c is higher than the second reference potential, a high-level comparison result signal indicating that the power source potential from the terminal unit 1 of the system is used as the internal power source potential is transmitted from the second comparison means 612d.

The switching signal output portion 613 receives the first and second comparison result signals and the high level (the first state) of the setting means 10A. The foregoing high level causes the first power source potential discriminating portion 611 to transmit a switching signal corresponding to the first comparison result signal.

In the foregoing case, the power source potential of the terminal unit 1 of the system is 5 V and as well as the potential appearing at the first connection node 611c of the first potential generating means of the first power source potential discriminating portion 611 is higher than the first reference potential of the first reference potential generating means 611e. Therefore, the first power source potential discriminating portion 611 transmits a high-level first comparison result signal. Thus, the switching signal output portion 613 transmits the high-level switching signal.

That is, the comparison means 613d of the switching signal output portion 613 transmits a switching signal that corresponds to the first comparison result signal from the first comparison means 611d of the first power source potential discriminating portion 611.

As a result, the foregoing structure is different from the case where the rated power source potential of the terminal unit 1 of the system is 3 V. The other operations are the same as those to be performed when the rated power source potential of the terminal unit 1 of the system is 3 V. Therefore, the detailed description of the ensuing operation is omitted here.

The integrated circuit 6A according to the first embodiment has the following advantages.

(1) The foregoing integrated circuit 6A comprises the power source potential discriminating circuit 61 A having the first power source potential discriminating portion 611 to be adaptable to the case where the rated power source potential of the terminal unit 1 of the system is 5 V and the second power source potential discriminating portion 612 to be adaptable to the case where the rated power source potential of the terminal unit 1 of the system is 3 V. Therefore, initial making of the resistors 611a and 611b and resistors 612a and 612b to be adaptable to the rated values enables each resistance value to be optimum. Therefore, the potential corresponding to the foregoing rated value and the reference potential can be subjected to a comparison.

Furthermore, the memory card having the foregoing integrated circuit 6A mounted thereon is enabled to eliminate the conventional necessity of afterward providing the attached-type resistor for the setting means 10A for switching to be adaptable to the rated value. Therefore, the number of elements required to be mounted can be decreased and thus the productivity can be improved. Furthermore, the degree of internal integration can be raised.

(2) The foregoing integrated circuit 6A comprises the power source switching circuit 62A which has the transistors 62d and 62g disposed between the internal power source potential node 6b and the first backup power source potential node 6d and serving as diode devices connected in opposite directions during operation to supply the power source potential of the terminal unit 1 of the system to the internal power source potential node 6b. Therefore, the flow of electric currents from the first backup power source 8 to the internal power source potential node 6b is interrupted. Thus, waste consumption of electric power in the first backup power source 8 can be prevented.

In the foregoing integrated circuit 6A, if a new button battery is used as the first backup power source 8, the power source potential of the first backup power source 8 is 3.3 V to 3.4 V, a potential difference greater than the threshold of the transistor 62d is generated between the internal power source potential and the first backup power source 8 in a case where the rated power source potential of the terminal unit 1 of the system is 3 V and the lowest potential of 2.7 V, which guarantees the operation, is supplied to the external power source potential node 6a. However, the transistor 62g interrupts the electric current, and thus the consumption of the electric power in the first backup power source 8 can be prevented.

Furthermore, the bypass means 62f connected between the internal power source potential node 6b and the first backup power source potential node 6d has the plural diode devices 62f1 and 62f3. Therefore, the consumption of electric power in the first backup power source 8 can be also prevented.

(3) Furthermore, the foregoing integrated circuit 6A has the alarm signal generating circuit 63A comprising the potential generating means composed of the resistors

63c and 63d so that the power source potential of the first backup power source 8 divided by the potential generating means is supplied to the comparison means 63b. Therefore, the reference potential of the reference potential generating means 63a can be lowered to, for example, 1.3 V in this embodiment. Therefore, the reference potential of the reference potential generating means 63a can be transmitted accurately if the rated power source potential of the terminal unit 1 of the system is 3 V.

Second Embodiment

Figure 2:
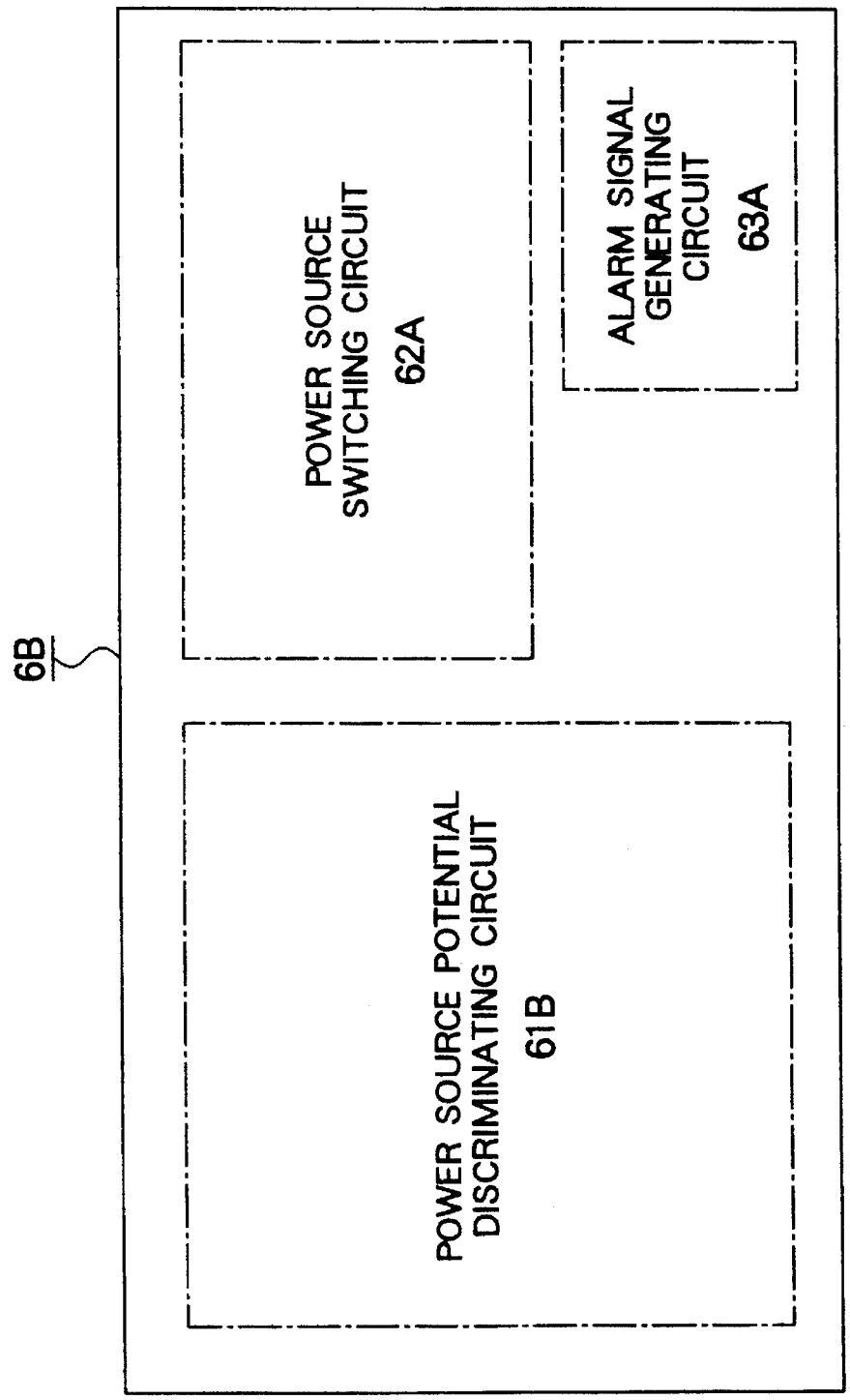
FIG. 2 is a block diagram which illustrates a semiconductor integrated circuit for controlling a power source according to a second embodiment of the present invention.

A second embodiment of the present invention will now be described with reference to FIGS. 2 and 3. Since the second embodiment differs from the first embodiment shown in FIG. 1 only in the power source potential discriminating circuit (means), structures except the power source potential discriminating circuit are omitted from description below.

As contrasted with the power source potential discriminating circuit 61 A according to the first embodiment in which the potential generating means is provided for each of the first and second power source potential discriminating portions 611 and 612, the power source potential discriminating circuit 61B according to the second embodiment is structured such that the potential generating means is composed of three resistors 61a, 61f and 61g in series connected between the external power source potential node 6a and the ground potential node. Furthermore, the potential generating means is commonly provided for each of the first and second power source potential discriminating portions 611B and 612B.

Figure 3:
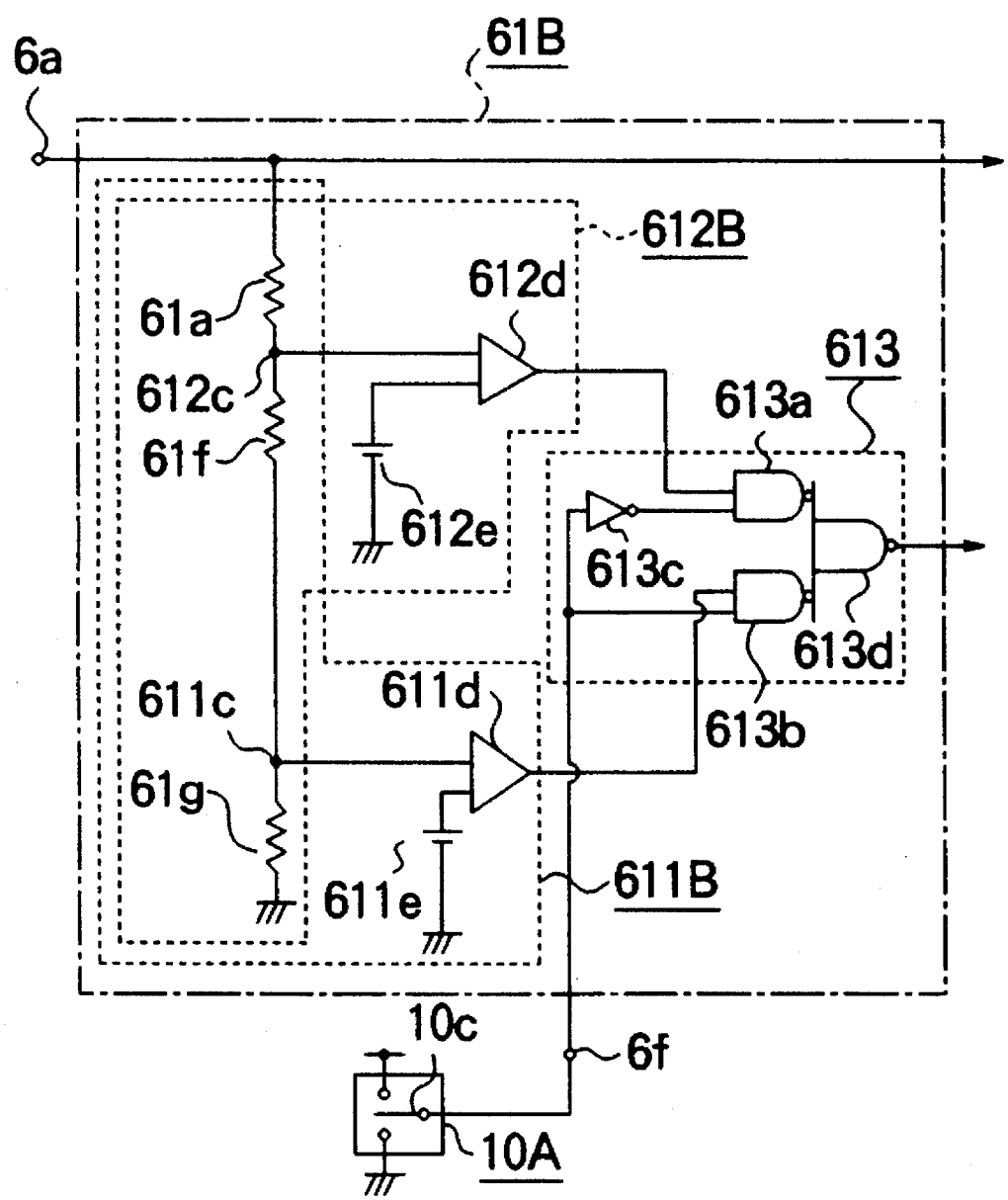
FIG. 3 is a circuit diagram which illustrates the power source potential discriminating circuit shown in FIG. 2.

Specifically, the connection node 611c between the resistors 61f and 61g is connected to one of the input terminals of the first comparison means 611d of the first power source potential discriminating portion 611B, as shown in FIG. 3. The connection node 612c between the resistors 61a and 61f is connected to one of the input terminals of the second comparison means 612d of the second power source potential discriminating portion 612B.

The resistance values of the resistors 61a, 61f and 61g are set to 600 kΩ (the resistor 61a), 140 kΩ (the resistor 61f) and 460 kΩ (the resistor 61g), respectively so as to cause a voltage level of 1.35 V to appear at the connection node 611c when the lowest potential of the power source potential for the operation to be guaranteed is 4.5 V in a case where the rated power source potential for the terminal unit 1 of the system is 5 V and cause the voltage level of 1.35 V to appear at the connection node 612c when the lowest potential of the power source potential for the operation to be guaranteed is 2.7 V in a case where the rated power source potential for the terminal unit 1 of the system is 3 V.

The power source potential discriminating circuit 61B structured as described above is operated as follows.

In the case where the rated value is 3 V, the setting node 6f is connected to the ground potential node by the switching means 10c of the setting means 10A so that a low level (the second state) is transmitted. Therefore, the switching signal output portion 613 transmits a switching signal on the basis of the second comparison result signal from the second comparison means 612d of the second power source potential discriminating portion 612B.

Therefore, in the second power source potential discriminating portion 612B, the potential appeared at the connection node 612c corresponding to the power source potential of the terminal unit 1 of the system and the second reference potential are subjected to a comparison by the second comparison means 612d. As a result, a switching signal on the basis of the second comparison result signal from the second comparison means 612d is transmitted from the switching signal output portion 613 to the power source switching circuit 62A.

In the case where the rated value is 5 V, the setting node 6f is connected to the power source potential node by the setting means 10A to transmit the high level (the first state). Therefore, the switching signal output portion 613 transmits the switching signal on the basis of the first comparison result signal from the first power source potential discriminating portion 611B.

Therefore, in the first power source potential discriminating portion 611B, the potential appeared at the first connection node 611c corresponding to the power source potential of the terminal unit 1 of the system and the first reference potential are subjected to a comparison by the first comparison means 611d. A switching signal on the basis of the first comparison result signal from the first comparison means 611d is transmitted from the switching signal output portion 613 to the power source switching circuit 62A.

Since the operations of the second embodiment except the foregoing operations are the same as those of the first embodiment, their descriptions are omitted here.

The thus-constituted integrated circuit 6B according to the second embodiment has the structure similar to that according to the first embodiment such that the first power source potential discriminating portion 611B is provided to be adaptable to the case where the rated power source potential of the terminal unit 1 of the system is 5 V and the second power source potential discriminating portion 612B is provided to be adaptable to the case where the rated power source potential of the terminal unit 1 of the system is 3 V. Therefore, initial forming of the resistors 61a, 61f and 61g to be adaptable to the foregoing rated values enables each resistance value to be made optimum. Therefore, the potential corresponding to the foregoing rated value and the reference potential can be subjected to an accurate comparison.

Furthermore, the memory card having the foregoing integrated circuit 6B mounted thereon is able to eliminate the conventional necessity of afterward providing the attached-type resistor to the setting means 10A for switching to be adaptable to the foregoing rated value. Therefore, the number of elements required to be mounted can be decreased and thus the productivity can be improved. Furthermore, the degree of internal integration can be raised.

The foregoing integrated circuit 6B has the advantages (2) and (3) similar to the first embodiment and (4) only one route is formed from the external power source potential node 6a to the ground potential node for discriminating the power source potential. Furthermore, the rated value between the external power source potential node 6a and the ground potential node can be enlarged. Therefore, the consumption of electric currents from the external power source potential node 6a for discriminating the power source potential can be reduced. That is, the total resistance value permitted to be used is limited depending upon the area of the chip in the case of an IC chip. According to the second embodiment, the impedance between the power source and the ground can be made maxim under the same total resistance value condition. Therefore, the electric current consumption can be reduced.

Third Embodiment

Figure 4:
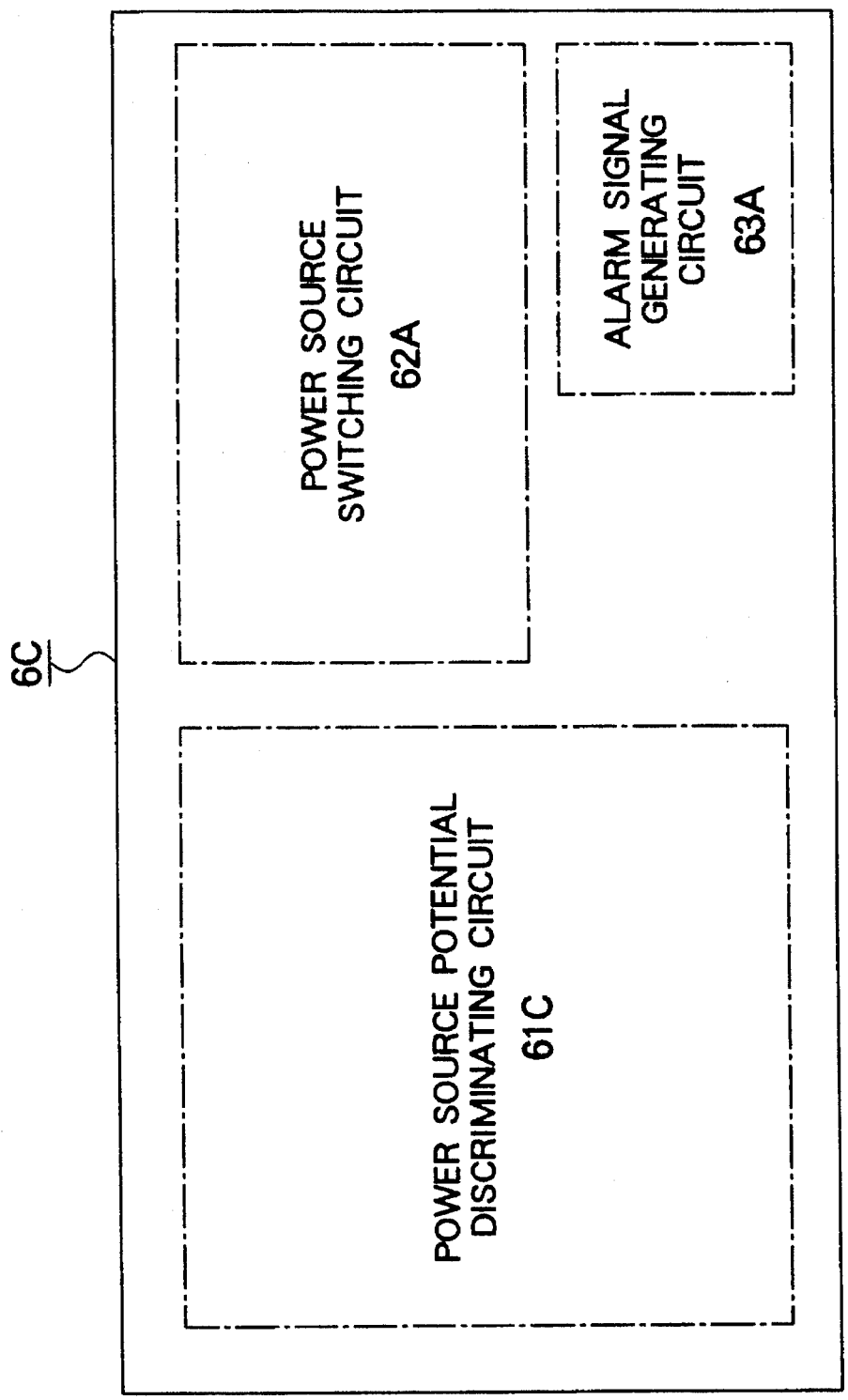
FIG. 4 is a block diagram which illustrates a semiconductor integrated circuit for controlling a power source according to a third embodiment of the present invention.

A third embodiment of the present invention will now be described with reference to FIGS. 4 and 5. Since the third embodiment differs from the first embodiment shown in FIG. 1 in only the power source potential discriminating circuit, structures except the power source potential discriminating circuit are omitted from the description.

Figure 5:
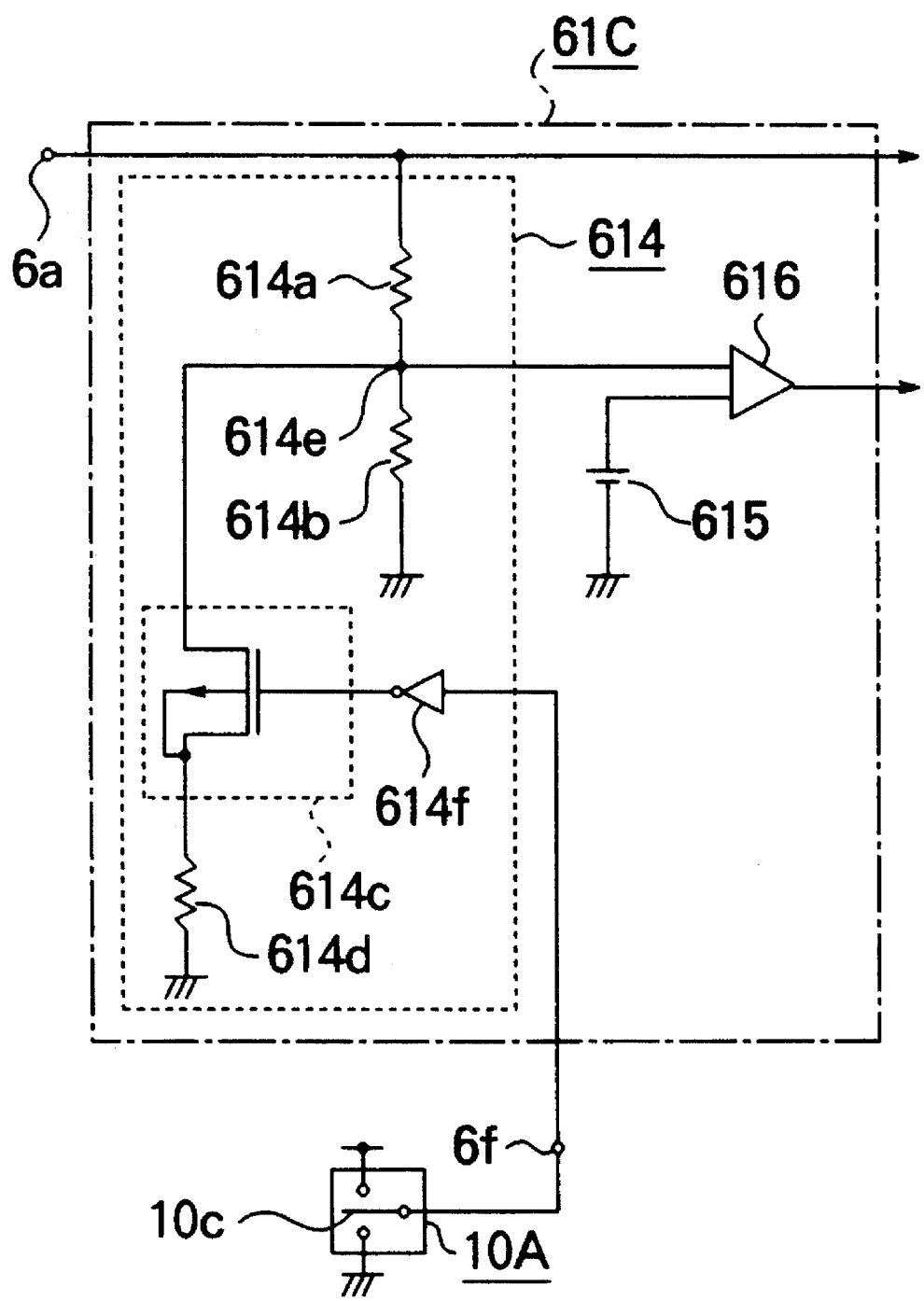
FIG. 5 is a circuit diagram which illustrates the power source potential discriminating circuit shown in FIG. 4.

Referring to FIG. 5, the power source potential discriminating circuit 61C comprises a potential generating means 614, a reference potential generating means 615 and a comparison means 616.

The potential generating means 614 has a structure that the ratio of the resistance value between the external power source potential node 6a and the connection node 614e and the resistance value between the ground potential node and the connection node 614e is changed depending upon the state of the setting node 6f. Thus, a potential corresponding to the external power source potential supplied to the external power source potential node 6a is transmitted to the connection node 614e. The potential generating means 614 comprises resistors 614a and 614b in series connected between the external power source potential node 6a and the ground potential node and has a connection point serving as a connection node 614e; a switching means comprising a P-channel MOS transistor 614c having one of main electrodes connected to the connection node 614e, a backgate connected to another main electrode and a gate electrode connected to the setting node 6f through the invertor 614f; and a resistor 614d connected between another main electrode of the transistor 614c and the ground node.

If the potential of the setting node 6f is the ground potential (a low level in a case where the rated power source potential of the terminal unit 1 of the system is 3 V), the potential is inverted by the invertor 614f so that the transistor 614c is made non-conductive. Therefore, the potential generating means 614 has a function similar to that of a series structure comprising the resistors 614a and 614b. As a result, a voltage level of 1.35 V appears at the connection node 614e when the lowest power source potential that guarantees the operation.

If the potential of the setting node 6f is the power source potential (a high level in a case where the rated power source potential of the terminal unit 1 of the system is 5 V), the potential is inverted by the invertor 614f so that the transistor 614c is made conductive. Therefore, the potential generating means 614 has a function similar to that of a series structure comprising the resistor 614a and a parallel resistor of the resistors 614b and 614d. If the lowest power source potential that guarantees the operation is 4.5 V, a voltage level of 1.35 V appears at the connection node 614e.

Therefore, the resistors 614a, 614b and 614d have resistance values of, for example, 600 kΩ (the resistor 614a), 600 kΩ (the resistor 614b) and 460 kΩ (the resistor 614d), respectively.

The reference potential generating means 615 generates a reference potential (1.35 V in this embodiment) and has a structure similar to that of the first reference potential generating means 611e according to the first embodiment.

The comparison means 616 has one input terminal to which the connection node 614e of the potential generating means 614 is connected and another input terminal that receives the reference potential from the reference potential generating means 615. If the potential appeared at the connection node 614e is higher than the reference potential, the comparison means 616 transmits a switching signal for instructing use of the external power source potential. If the same is lower than the reference potential, the comparison means 616 transmits a switching signal for instructing use of the backup power source potential. In this embodiment, the comparison means 616 transmits a switching signal, the level of which is high if the potential appeared at the connection node 614e is higher than the reference potential and the level of which is low if the potential is lower than the reference potential.

The power source potential discriminating circuit 61C having the foregoing structure is operated as follows.

In the case where the rated value is 3 V, the setting means 10A is brought to a state where it transmits a low level (the second state). Therefore, the transistor 614c of the potential generating means 614 is made non-conductive.

Therefore, the potential appearing at the connection node 614e of the potential generating means 614 is a potential expressed by the potential divided by the resistors 614a and 614b and corresponding to the power source potential supplied to the external power source potential node 6a. The potential appearing at the connection node 614e is 1.35 V when the lowest power source potential that guarantees the operation is 2.7 V. Therefore, the comparison means 616 transmits a high-level switching signal when the power source potential supplied to the external power source potential node 6a is 2.7 V or higher and a low-level switching signal when the same is lower than 2.7 V.

In the case where the rated value is 5 V, the setting means 10A is brought to a state where it transmits a high level (the first state). Therefore, the transistor 614c of the potential generating means 614 is made conductive.

Therefore, the potential appearing at the connection node 614e of the potential generating means 614 is a potential expressed by the potential divided by the resistor 614a and the parallel resistor of the resistors 614b and 614d and corresponding to the power source potential supplied to the external power source potential node 6a. Since the potential appearing at the connection node 614e is 1.35 V when the lowest power source potential that guarantees the operation is 4.5 V, the comparison means 616 transmits a high-level switching signal if the power source potential supplied to the external power source potential node 6a is 4.5 V or higher and a low-level switching signal if the same is lower than 4.5 V.

Since the operations of the third embodiment except the foregoing operations are the same as those of the first embodiment, their descriptions are omitted here.

Similarly to the first embodiment, the integrated circuit 6C constituted as described above has the potential generating means 614 to be adaptable to the cases where the rated power source potential of the terminal unit 1 of the system is 5 V and 3 V. Therefore, initial forming of the resistors 614a, 614b and 614c to correspond to the foregoing rated values enables each resistance value to be made optimum. Thus, the potential corresponding to the foregoing rated value and the reference potential can be subjected to an accurate comparison.

The memory card having the integrated circuit 6C mounted thereon is able to eliminate the conventional necessity of afterwards providing the attached-type resistance for the setting means 10A for switching to be adaptable to the foregoing rated values. Therefore, the number of elements required to be mounted can be decreased, the productivity can be improved and the degree of internal integration can be raised.

Furthermore, the integrated circuit 6C has the foregoing advantages (2) and (3) and (5) such that the number of circuit devices constituting the power source potential discriminating circuit 64C can be decreased and the degree of integration as the integrated circuit can be raised.

Fourth Embodiment

Figure 6:
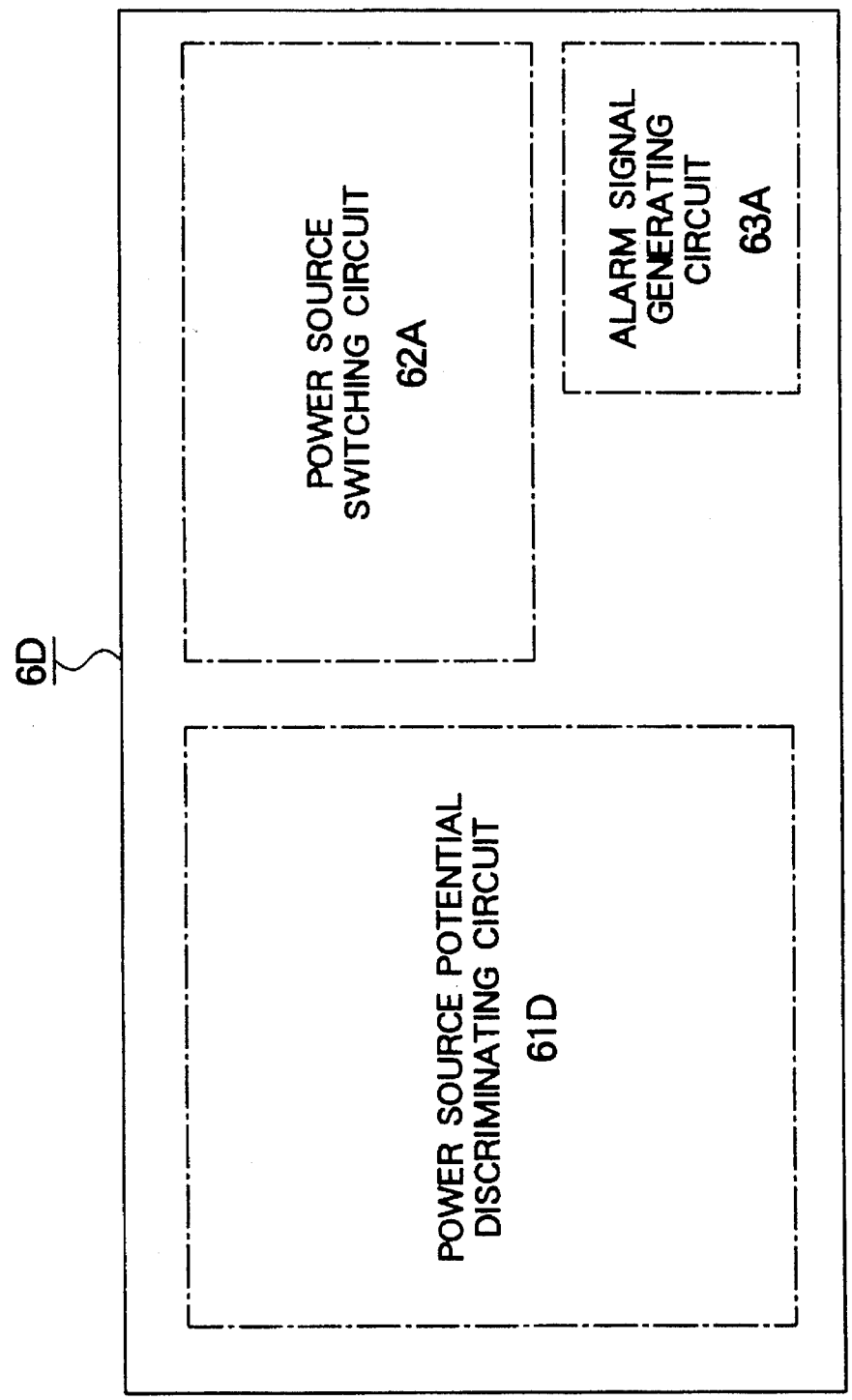
FIG. 6 is a block diagram which illustrates a semiconductor integrated circuit for controlling a power source according to a fourth embodiment of the present invention.

A fourth embodiment of the present invention will now be described with reference to FIGS. 6 and 7. Since only the power source potential discriminating circuit is different from the first embodiment shown in FIG. 4, structures except the power source potential discriminating circuit are omitted from illustration.

Figure 7:
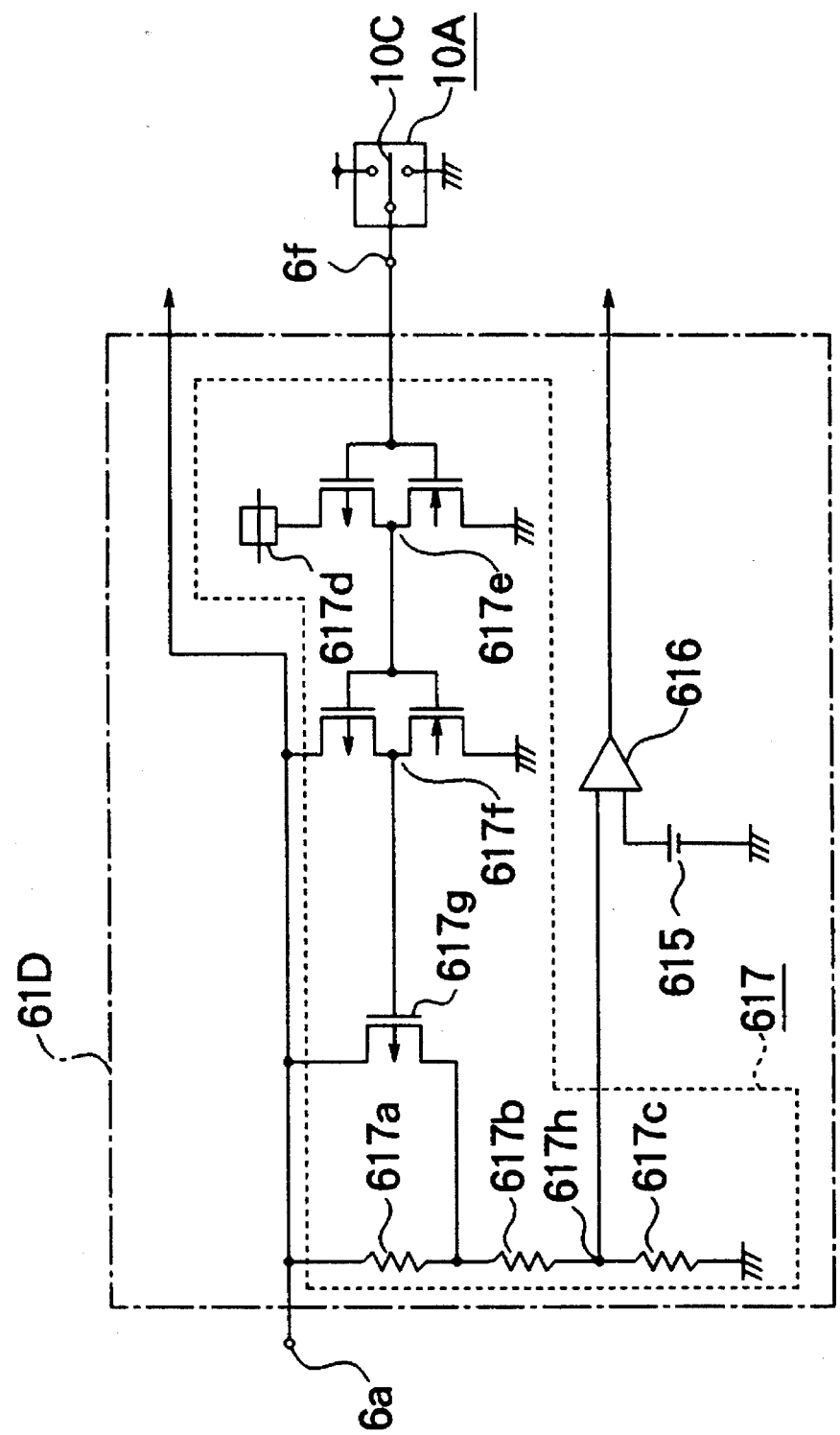
FIG. 7 is a circuit diagram which illustrates the power source potential discriminating circuit shown in FIG. 6.

Referring to FIG. 7, a power source potential discriminating means 61D comprises a reference potential generating means 615, a comparison means 646, and a potential generating means 617 connected between the external power source potential node 6a and the ground potential node.

The potential generating means 647 comprises resistors 617a, 617b and 647c; an invertor 617e connected between the internal power source 617d and the ground potential and comprising a PMOS transistor and an NMOS transistor; an invertor 617f connected between the external power source potential node 6a and the ground potential and comprising a PMOS transistor and an NMOS transistor; and a PMOS 617g. Note that the resistors 617a, 617b and 617c have resistance values of, for example, 800 kΩ, 600 kΩ and 600 kΩ respectively.

When the setting means 40A is set to the rated power source potential of the terminal unit 1 of the system of 3 V, that is, the low level (the second state), the transistor 617g of the potential generating means 617 is made conductive. Therefore, the potential appearing at the connection node 617h of the potential generating means 617 is expressed by a potential divided by the resistors 617b and 617c because the resistor 617a is short-circuited, the potential corresponding to the power source potential supplied to the external power source potential node 6a. The potential appearing at the connection node 617h is 1.35 V when the lowest potential of the power source potential that guarantees the operation is 2.7 V. Therefore, the comparison means 616 transmits a switching signal, the level of which is high when the power source potential of the external power source potential node 6a is 2.7 V or higher and the level of which is low when the power source potential is lower than 2.7 V.

When the setting means 10A is set to the rated value of 5 V, that is, a high level (the first state), the transistor 617g of the potential generating means 617 is made non-conductive. Therefore, the potential appearing at the connection node 617h of the potential generating means 617 is expressed by a potential divided by the resistors 617a and 617b and the resistor 617c, the potential corresponding to the power source potential supplied to the external power source potential node 6a. Since the potential appearing at the connection node 617h is 1.35 V when the lowest power source potential that guarantees the operation is 4.5 V, the comparison means 616 transmits a switching signal indicating a high level when the power source potential of the external power source potential node 6a is 4.5 V or higher and indicating a low level when the same is lower than 4.5 V.

Since the fourth embodiment requires only one comparison means 616, the circuit structure can be simplified. Furthermore, in a case where the structure comprises an IC, the area of the chip can be reduced and, thus, the cost of the chip can be reduced and the electric current consumption can be decreased. The portions having the same structures as those according to the first embodiment have similar effects.

Fifth Embodiment

Figure 8:
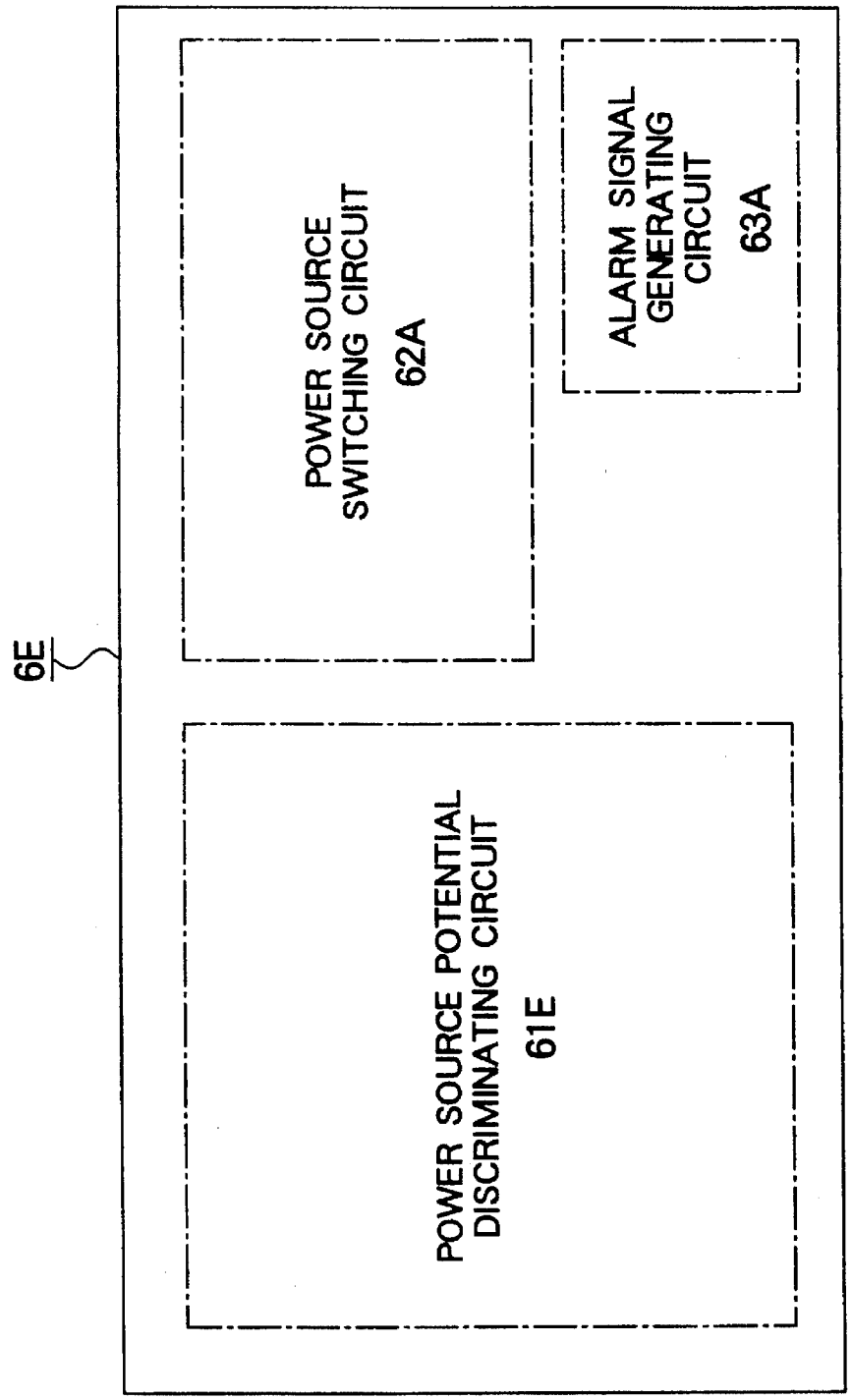
FIG. 8 is a block diagram which illustrates a semiconductor integrated circuit for controlling a power source according to a fifth embodiment of the present invention.
Figure 9:
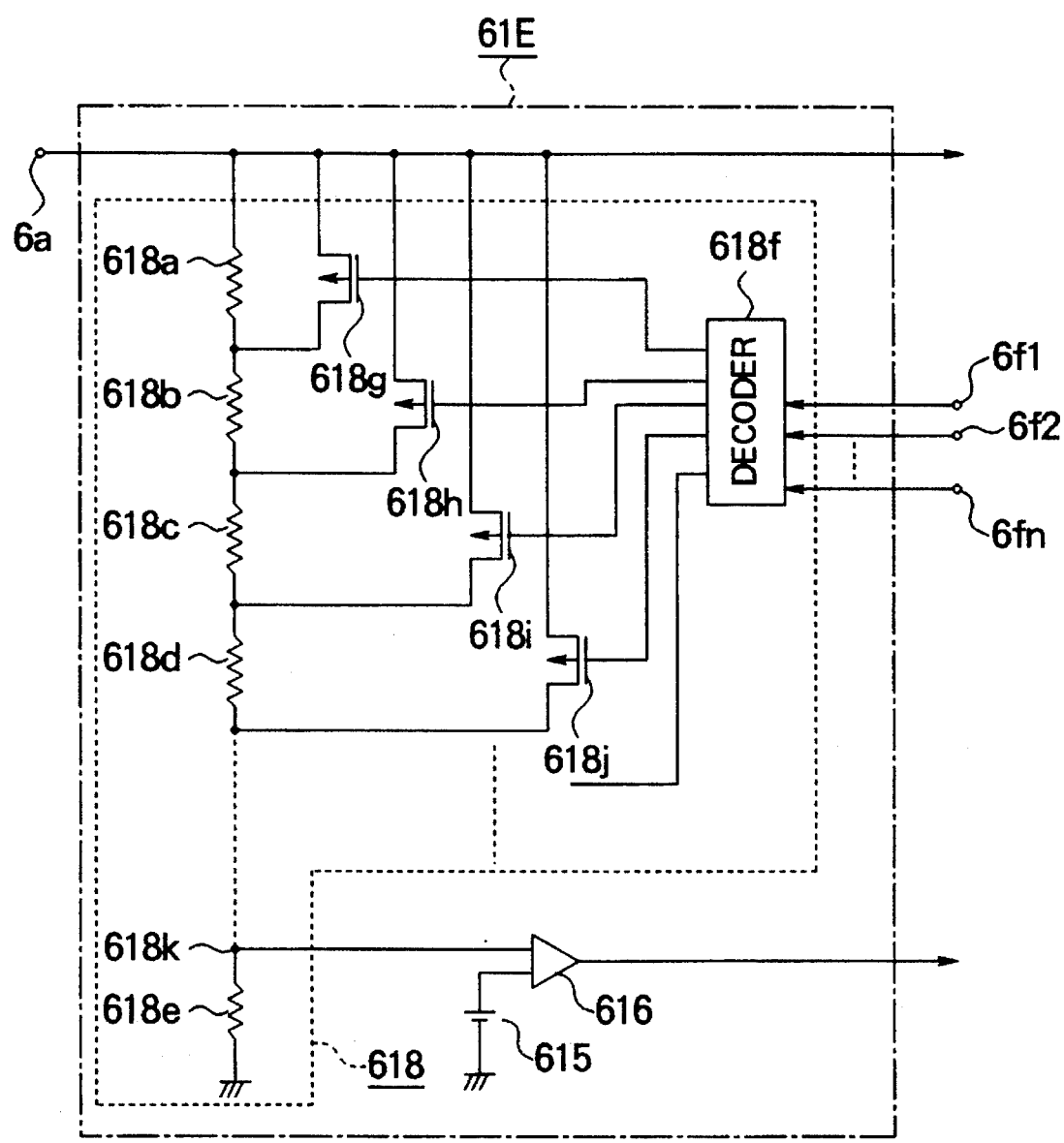
FIG. 9 is a circuit diagram which illustrates the power source potential discriminating circuit shown in FIG. 8.

A fifth embodiment of the present invention will now be described with reference to FIGS. 8 and 9. FIG. 9 is a circuit diagram showing a power source potential discriminating circuit according to the fifth embodiment of the present invention. The other structures are the same as those according to the first embodiment.

Referring to FIG. 9, a power source potential discriminating circuit 61E comprises a reference potential generating means 615, a comparison means 616 and a potential generating means 618 connected between the external power source potential node 6a and the ground potential node.

The potential generating means 618 comprises resistors 618a, 618b, 618c, 618d, ..., 618e; a decoder 618f connected to the setting node 6f (6f1, 6f2,..., 6fn); and PMOS transistors 618g, 618h, 618i, 618j, ..., the gate of each of which is connected to the decoder 618f.

As contrasted with the fourth embodiment in which two rated power source potentials of the terminal unit 1 of the system of 3 V and 5 V can be detected, the fifth embodiment has an arrangement that the division resistor is formed into a multiplicity of stages and a plurality of PMOS switches are provided while being connected in parallel. Thus, only one comparison means 616 is enabled to detect an arbitrary power source potential. The decoder 618f decodes a plurality of signals from the setting nodes 6f1, 6f2, ..., 6fn to control the PMOS switch. The fifth embodiment enables an arbitrary number of potentials to be detected without a necessity of increasing the number of the comparison means 616. The portions having the same structures as those according to the first embodiment have similar effects.

Sixth Embodiment

Figure 10:
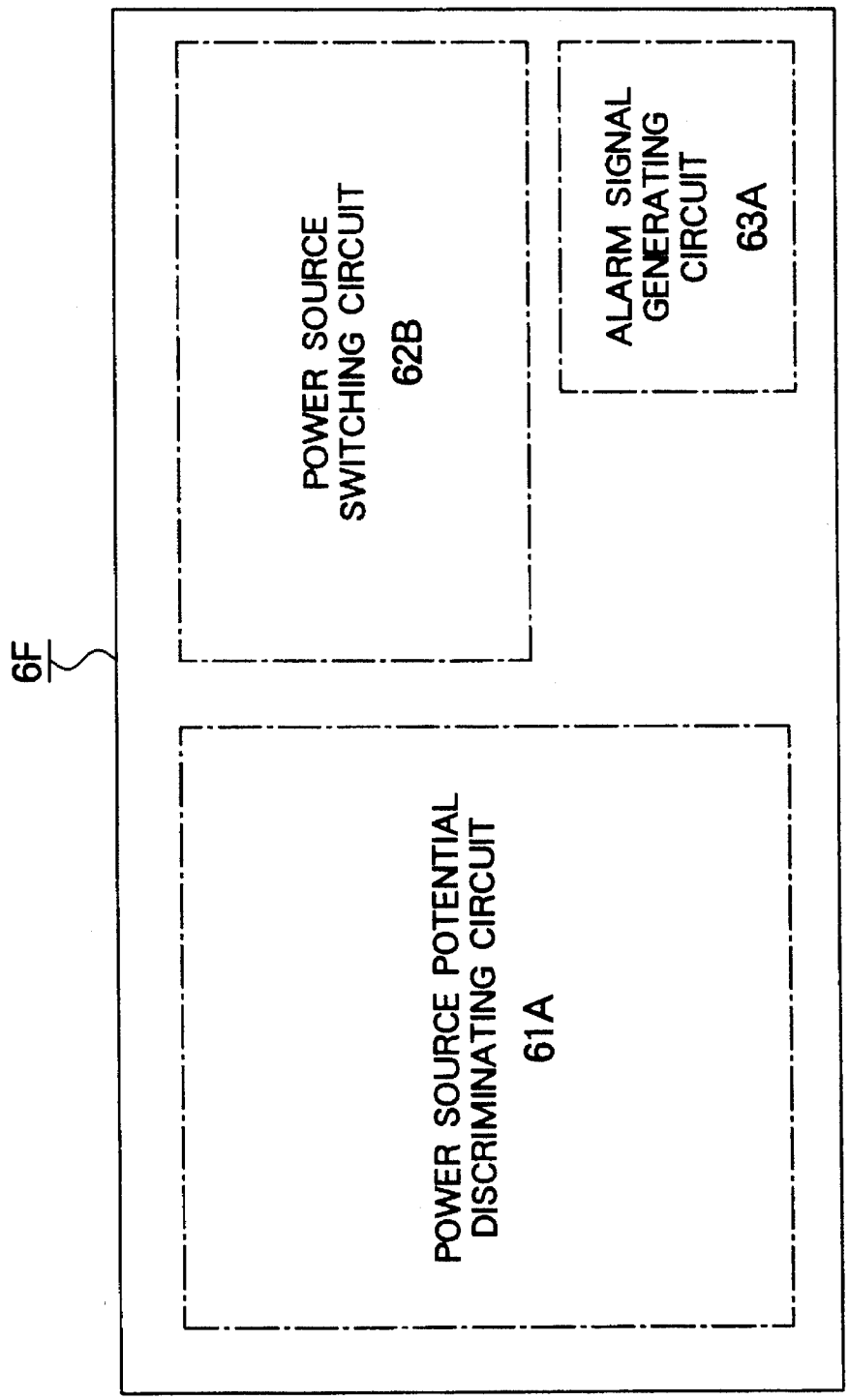
FIG. 10 is a block diagram which illustrates a semiconductor integrated circuit for controlling a power source according to a sixth embodiment of the present invention.
Figure 11:
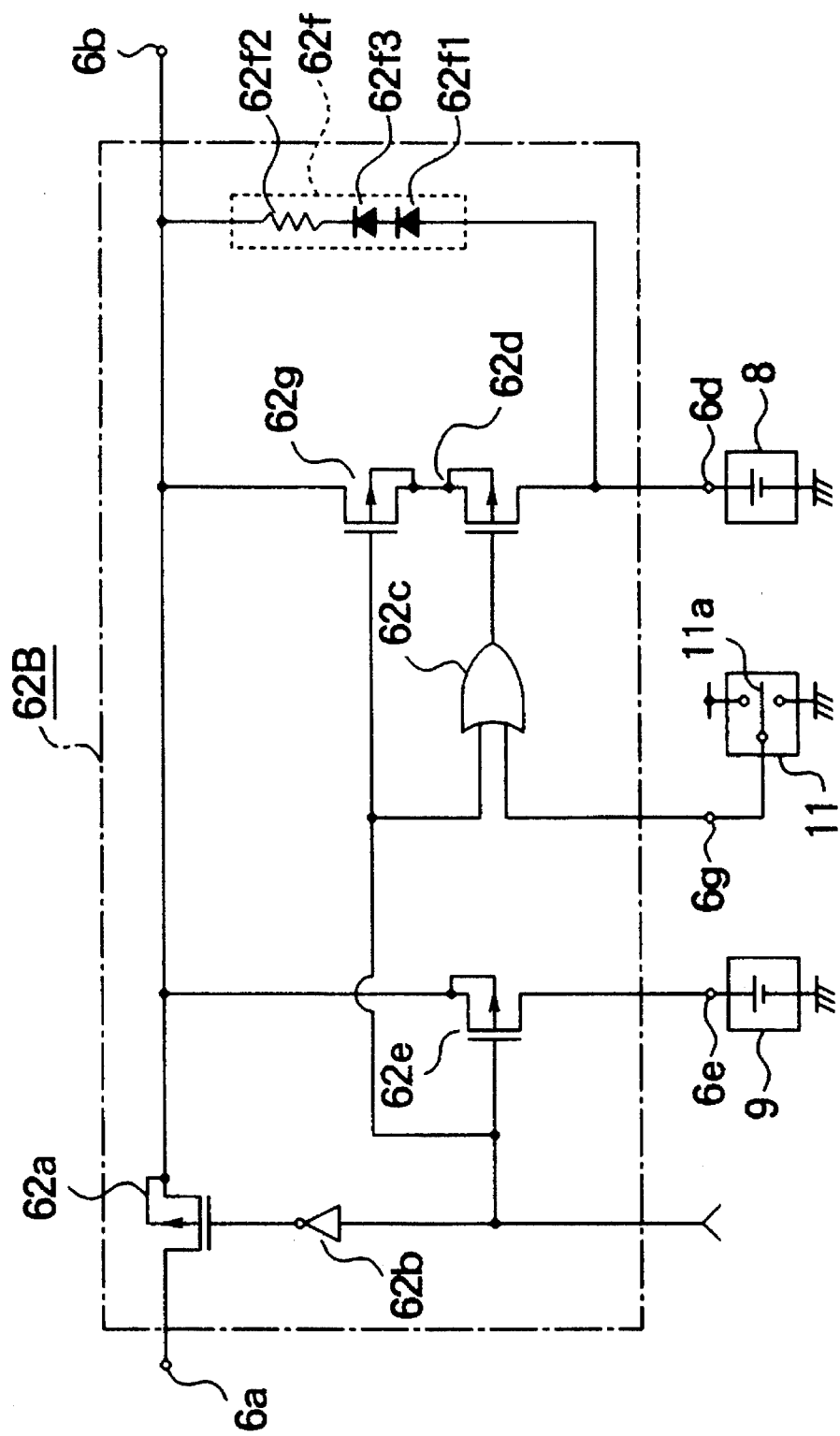
FIG. 11 is a circuit diagram which illustrates the power source switching circuit shown in FIG. 10.

A sixth embodiment of the present invention will now be described with reference to FIGS. 10 and 11. Since only the power source switching circuit is different from the first embodiment shown in FIG. 1, the structures except the power source switching circuit are omitted from illustration.

As contrasted with the power source switching circuit 62A according to the first embodiment has the structure that the transistor 62d constituting the switching means connected between the first backup power source potential node 6d and the internal power source potential node 6b is connected to the internal power source potential node 6b; and the transistor 62g is connected to the first backup power source potential node 6d, the power source switching circuit 62B according to the sixth embodiment has a structure that the transistor 62d is connected to the first backup power source potential node 6d and the transistor 62g is connected to the internal power source potential node 6b.

An integrated circuit 6F having the foregoing structure is operated similar to the first embodiment and has the advantages (1) to (3) similar to the first embodiment.

Seventh Embodiment

Figure 12:
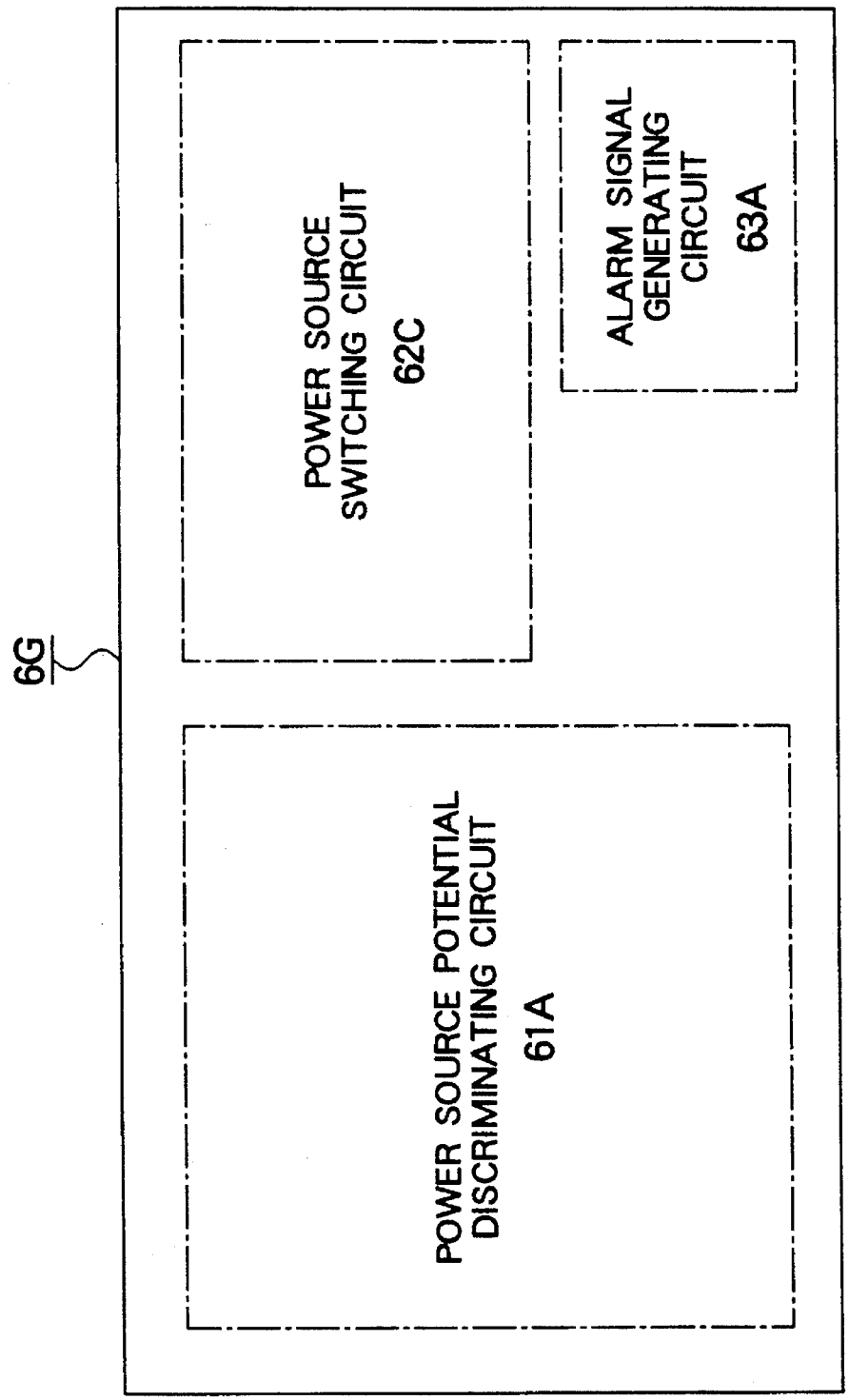
FIG. 12 is a block diagram which illustrates a semiconductor integrated circuit for controlling a power source according to a seventh embodiment of the present invention.
Figure 13:
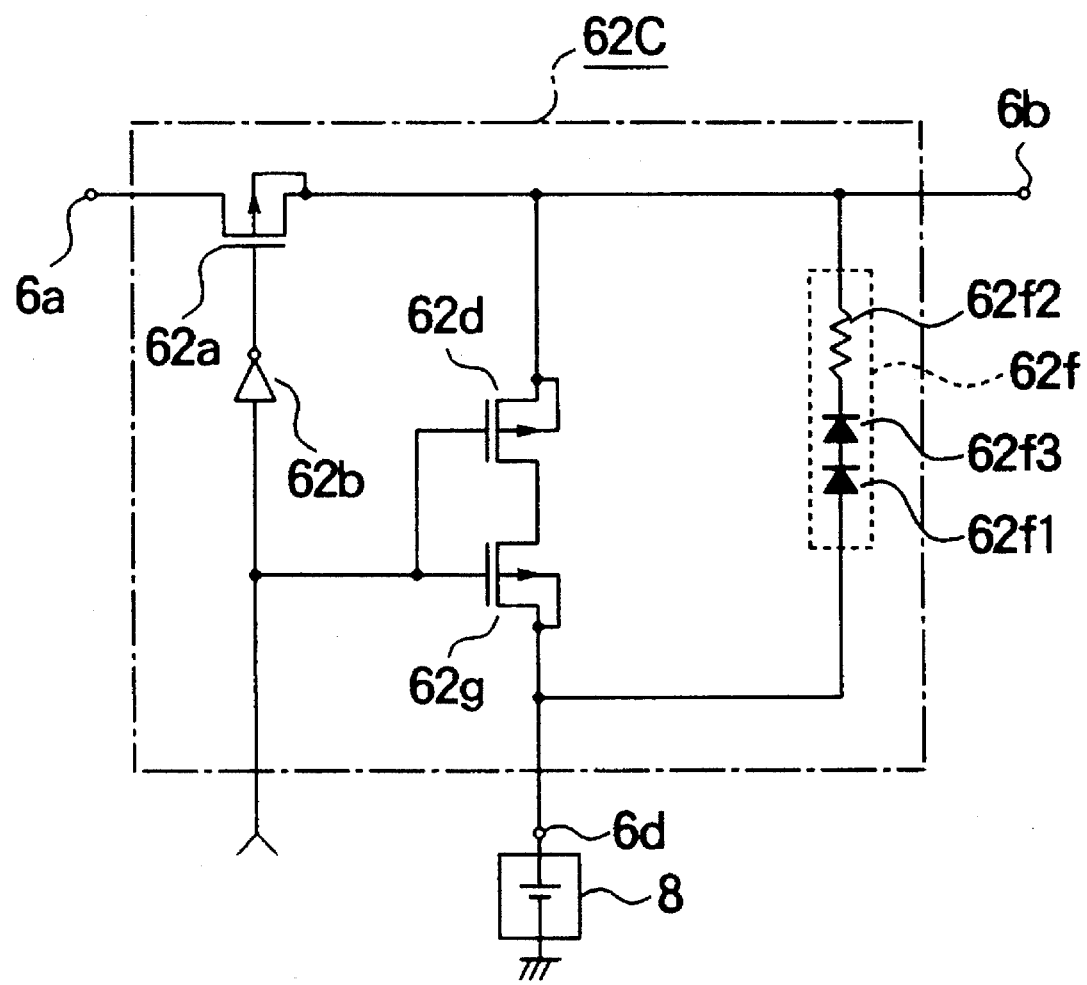
FIG. 13 is a circuit diagram which illustrates the power source switching circuit shown in FIG. 12.

A seventh embodiment of the present invention will now be described with reference to FIGS. 12 and 13. Since only the power source switching circuit is different from the first embodiment, the structures except the power source switching circuit are omitted from illustration.

As contrasted with the power source switching circuit 62A according to the first embodiment which is adapted to a memory card 2 having the first and second backup power sources 8 and 9, the power source switching circuit 62C according to the seventh embodiment is adapted to the memory card 2A having only the first backup power source 8 mounted thereon.

Therefore, the power source switching circuit 62C according to the seventh embodiment is different from that according to the first embodiment shown in FIG. 1 in that the second backup power source potential node 6e is omitted, the transistor 62e connected between the second backup power source potential node 6e and the internal power source potential node 6b is omitted, the logical operation means 62c is omitted, and the switching signal is directly supplied to the gate electrode of the transistor 62d from the power source potential discriminating circuit 61A.

The thus-structured power source switching circuit 62C according to the seventh embodiment has a structure that, when the switching signal from the power source potential discriminating circuit 61A is high level, that is, when the power source potential supplied from the terminal unit 1 of the system is higher than a predetermined value, the transistor 62a is made conductive. Thus, the power source potential of the terminal unit 1 of the system supplied to the external power source potential node 6a is supplied to the internal power source potential node 6b through the transistor 62a.

On the other hand, the transistors 62d and 62g are made non-conductive so that the first backup power source potential node 6d is simply electrically connected through the bypass means 62f. However, the potential of the internal power source potential node 6b is higher than the potential obtained by subtracting the thresholds of the diodes 62f1 and 62f3 of the bypass means 62f from the potential of the first backup power source potential node 6d. Therefore, the first backup power source potential node 6d and the internal power source potential node 6b are electrically non-conductive.

In a case where the switching signal is low level, that is, in a case where the power source potential supplied from the terminal unit 1 of the system is lower than a predetermined value, or in a case where the memory card 2A has been removed from the terminal unit 1 of the system, the transistor 62a is made non-conductive so that the external power source potential node 6a and the internal power source potential node 6b are made electrically non-conductive.

On the other hand, the transistors 62d and 62g are made conductive so that the first backup power source potential node 6d and the internal power source potential node 6b are made electrically conductive through the transistors 62d and 62g. Thus, the power source potential is supplied from the first backup power source 8 to the internal power source potential node 6b.

Since the operations except the foregoing operations are the same as those according to the first embodiment, their descriptions are omitted here.

The thus-constituted integrated circuit 6G according to the seventh embodiment has the foregoing advantages (*1*) to (*3*) similar to the first embodiment shown in FIG. 1.

Eighth Embodiment

Figure 14:
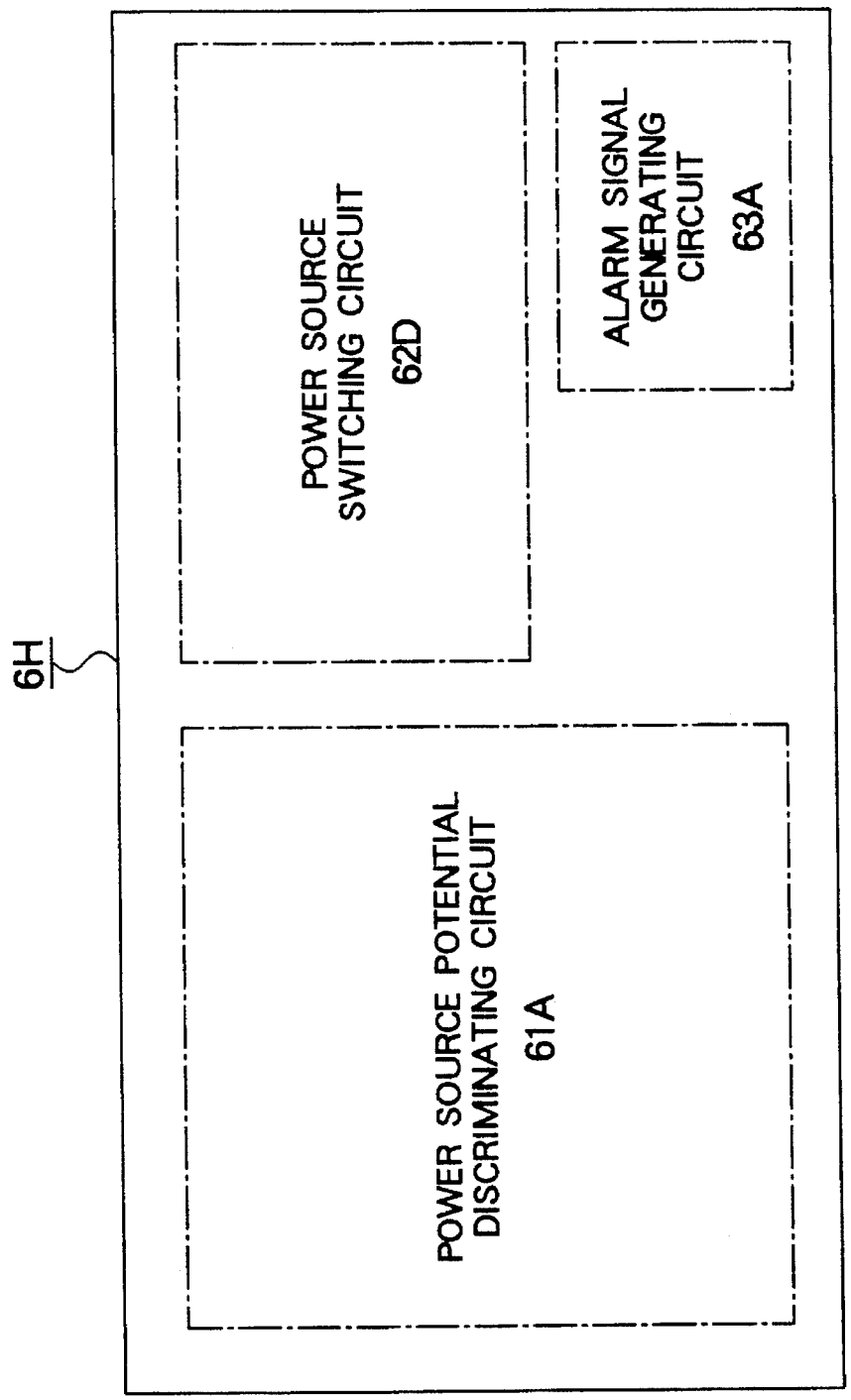
FIG. 14 is a block diagram which illustrates a semiconductor integrated circuit for controlling a power source according to an eighth embodiment of the present invention.
Figure 15:
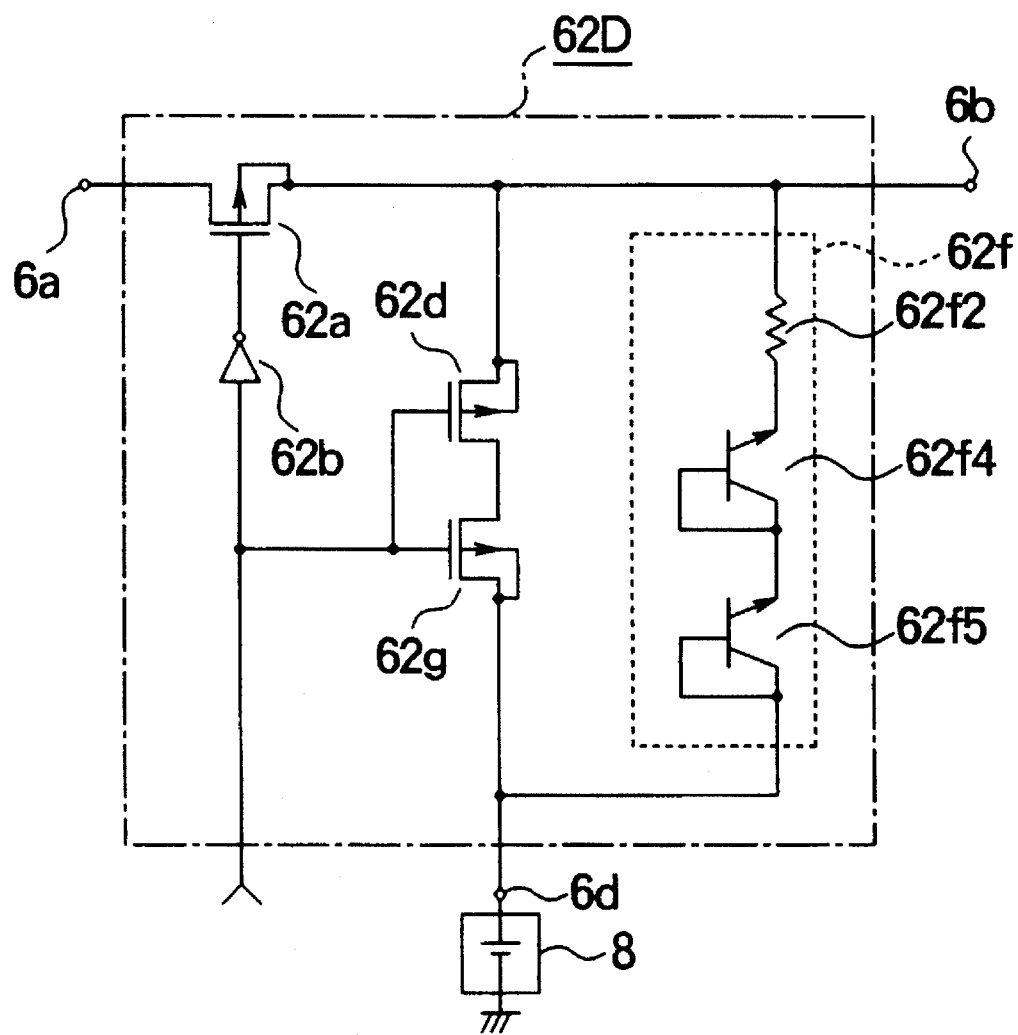
FIG. 15 is a circuit diagram which illustrates the power source switching circuit shown in FIG.
Figure 16:
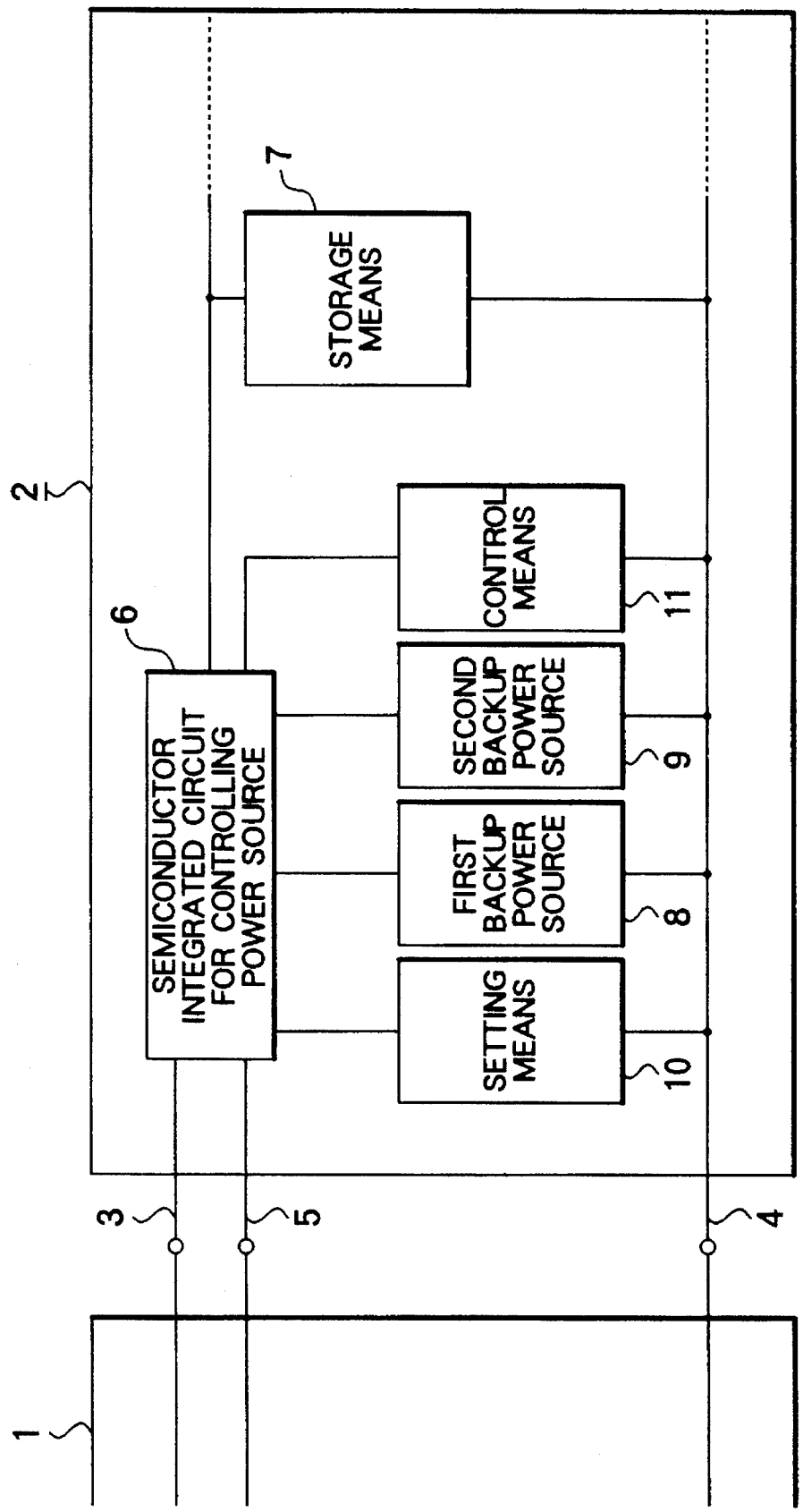
FIG. 16 is a block diagram which illustrates a memory card having two backup power sources mounted thereon.
Figure 17:
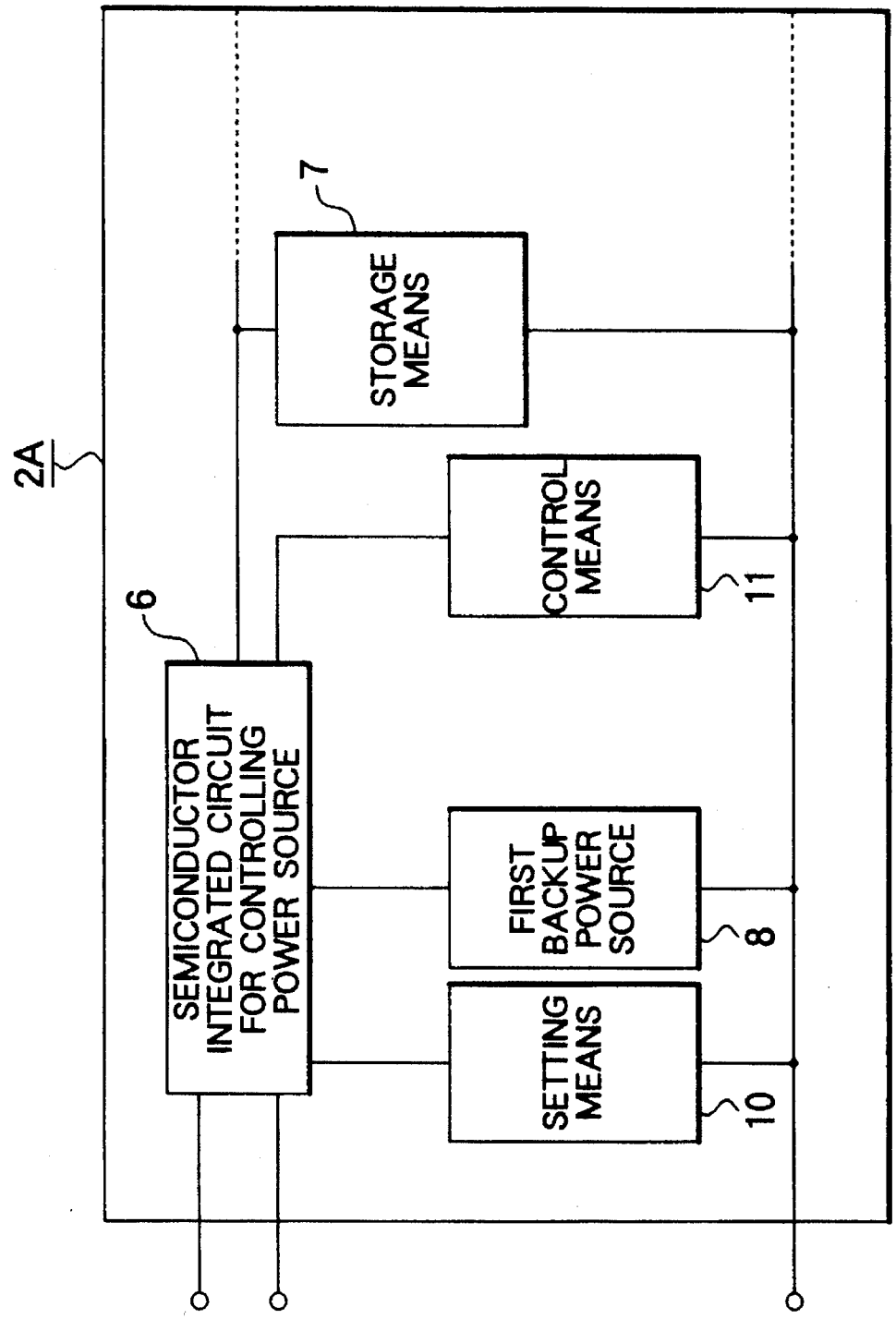
FIG. 17 is a block diagram which illustrates a memory card having only a first backup power source mounted thereon.
Figure 18:
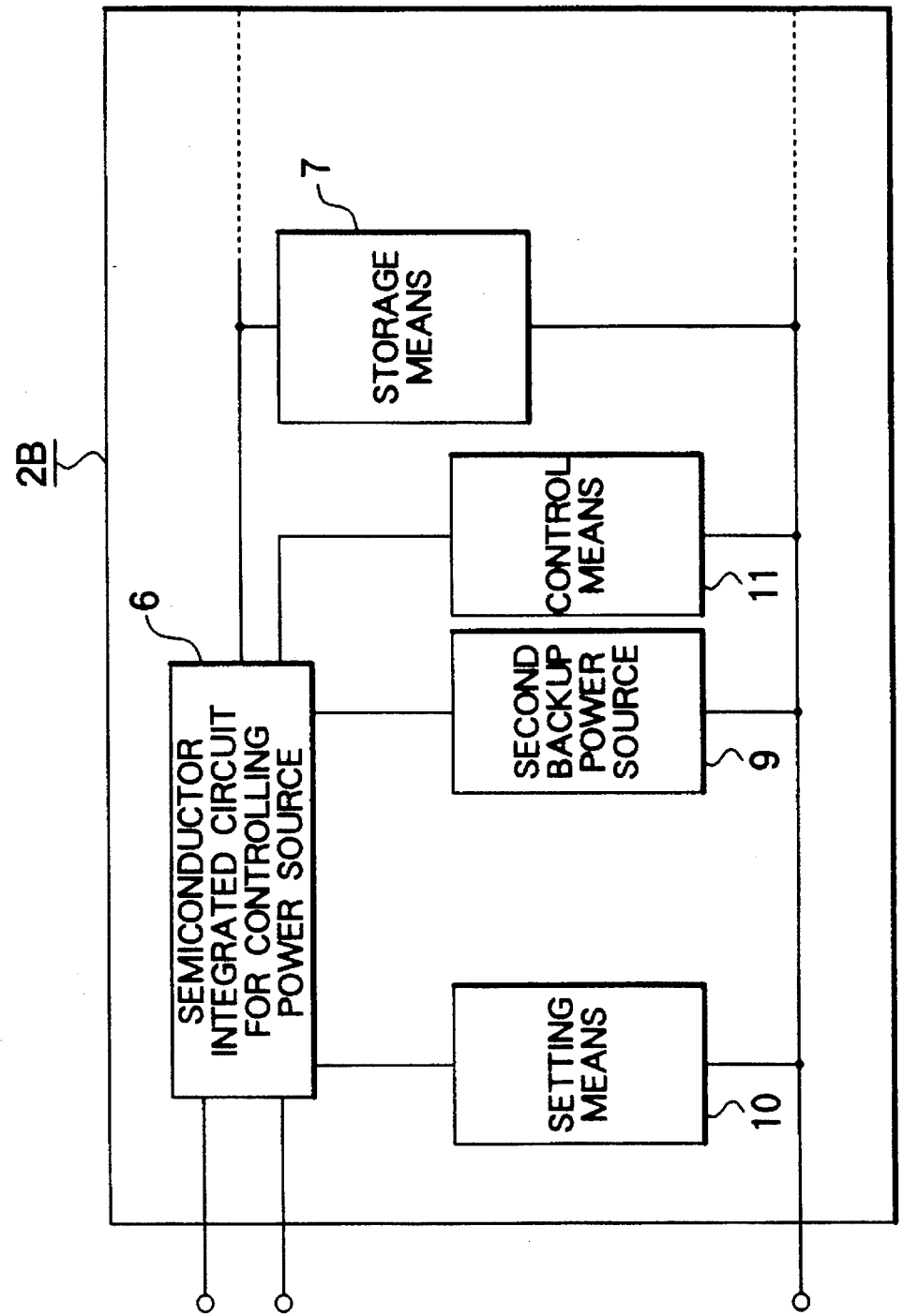
FIG. 18 is a block diagram which illustrates a memory card having only a second backup power source mounted thereon.

An eighth embodiment of the present invention will now be described with reference to FIGS. 14 and 15. As contrasted with the seventh embodiment, the eighth embodiment has a difference in that the structure of the bypass means 62f of the power source switching circuit 62D.

That is, the bypass means 62f of the power source switching circuit 62C according to the seventh embodiment comprises the diode devices 62f1 and 62f3 and the resistor 62f2 in series connected between the first backup power source potential node 6d and the internal power source potential node 6b. The bypass means 62f of the power source switching circuit 62D according to the eighth embodiment has a structure in which two npn bipolar transistors 62f4 and 62f5 serving as diode devices and the resistor 62f2 are in series connected.

The thus-constituted integrated circuit 6H according to the eighth embodiment can easily be manufactured. Furthermore, the advantages (1) to (3) obtainable from the first embodiment can be obtained similar to the seventh embodiment.

What is claimed is:

1. A semiconductor integrated circuit for controlling a power source, comprising:

an external power source potential node to which an external power source potential is supplied;

an internal power source potential node for transmitting an internal power source potential;

a backup power source potential node to which a backup power source potential is supplied from a backup power source;

a setting node to which a setting signal is supplied which indicates a first state where a rated value of said external power source potential to be supplied to said external power source potential node is a first potential or a second state where said rated value is a second potential;

power source potential discriminating means which receives said external power source potential to be supplied to said external power source potential node and said setting signal to be supplied to said setting node, which obtains a first power source potential on the basis of said external power source potential if said setting signal indicates said first state to subject said first power source potential and a first reference potential to a comparison, which transmits a switching signal indicating use of said external power source potential to be supplied to said external power source potential node if said first power source potential is higher than said first reference potential or use of said backup power source potential to be supplied to said backup power source potential node if said first power source potential is lower than said first reference potential, which obtains a second power source potential on the basis of said external power source potential if said setting signal indicates said second state to subject said second power source potential and a second reference potential to a comparison, which transmits a switching signal indicating use of said external power source potential to be supplied to said external power source potential if said second power source potential is higher than said second reference potential or use of said backup power source potential to be supplied to said backup power source potential node if said second power source potential is lower than said second reference potential; and power source switching means which receives said switching signal from said power source potential discriminating means, which makes said external power source potential node and said internal power source potential node to be conductive if said switching signal indicates use of said external power source potential and which makes said backup power source potential node and said internal power source potential node to be conductive if said switching signal indicates use of said backup power source potential.

2. The semiconductor integrated circuit for controlling a power source according to claim 1 wherein said power source potential discriminating means includes:

a first power source potential discriminating portion having first potential generating means for generating a first power source potential on the basis of said external power source potential to be supplied to said external power source potential node and first comparison means for subjecting said first power source potential from said first potential generating means and said first reference potential to a comparison to transmit a first comparison result signal indicating use of said external power source potential to be supplied to said external power source potential node if said first power source potential is higher than said first reference potential or use of said backup power source potential to be supplied to said backup power source potential node if said first power source potential is lower than said first reference potential;

a second power source potential discriminating portion having second potential generating means for generating a second power source potential on the basis of said external power source potential to be supplied to said external power source potential node and second comparison means for subjecting said second power source potential from said second potential generating means and a second reference potential to a comparison to transmit a second comparison result signal indicating use of said external power source potential to be supplied to said external power source potential node if said second power source potential is higher than said second reference potential or use of said backup power source potential to be supplied to said backup power source potential node if said second power source potential is lower than said second reference potential; and a switching signal output portion which receives said first comparison result signal from said first power source potential discriminating portion, said second comparison result signal from said second power source potential discriminating portion and said setting signal to be supplied to said setting node, which transmits a signal corresponding to said first comparison result signal as said switching signal if said setting signal indicates said first state and which transmits a signal corresponding to said second comparison result signal as said switching signal if said setting signal indicates said second state.

3. The semiconductor integrated circuit for controlling a power source according to claim 2 wherein:

said first potential generating means of said first power source potential discriminating portion has two resistor devices in series connected between said external power source potential node and a ground node to transmit said first power source potential to a connection point said two resistor devices; and said second potential generating means of said second power source potential discriminating portion has two resistor devices in series connected between said external power source potential node and said ground node to transmit said second power source potential to a connection point of said two resistor devices.

4. The semiconductor integrated circuit for controlling a power source according to claim 3 further comprises alarm signal generating means having:

potential generating means for lowering said backup power source potential to be supplied to said backup power source potential node to transmit said lowered backup power source potential; and comparison means for subjecting said backup power source potential lowered by said potential generating means and a reference potential to a comparison to transmit an alarm signal if said lowered backup power source potential is lower than said reference potential.

5. The semiconductor integrated circuit for controlling a power source according to claim 2 wherein said first potential generating means of said first power source potential discriminating portion has first, second and third resistor devices in series connected between said external power source potential node and said ground node to transmit said first power source potential to a connection point between said second resistor device and said third resistor device; and said second potential generating means of said second power source potential discriminating portion consists of said first, second and third resistor devices to transmit said second power source potential to a connection point between said first resistor device and said second resistor device.

6. The semiconductor integrated circuit for controlling a power source according to claim 5 further comprises alarm signal generating means having:

potential generating means for lowering said backup power source potential to be supplied to said backup power source potential node to transmit said lowered backup power source potential; and comparison means for subjecting said backup power source potential lowered by said potential generating means and a reference potential to a comparison to transmit an alarm signal if said lowered backup power source potential is lower than said reference potential.

7. The semiconductor integrated circuit for controlling a power source according to claim 1 wherein said power source potential discriminating means includes:

potential generating means which receives said setting signal to be supplied to said setting node and which generates a first power source potential on the basis of said external power source potential to be supplied to said external power source potential node if said setting signal indicates said first state and which generates a second power source potential on the basis of said external power source potential to be supplied to said external power source potential node if said setting signal indicates said second state; and comparison means for subjecting said first or second power source potential and said reference potential to a comparison to transmit a switching signal indicating use of said external power source potential to be supplied to said external power source potential node if said first or second power source potential is higher than said reference potential or use of said backup power source potential to be supplied to said backup power source potential node if said first or second power source potential is lower than said reference potential.

8. The semiconductor integrated circuit for controlling a power source according to claim 7 wherein said potential generating means has a first resistor device connected between said external power source potential node and a connection node for transmitting said first or second power source potential, a second resistor device connected between said connection node and a ground node, a switching device and a third resistor device connected between said connection node and said ground node, and said switching device is made conductive if said setting signal to be supplied to said setting node is in said first state and made nonconductive if said setting signal is in said second state.

9. The semiconductor integrated circuit for controlling a power source according to claim 8 further comprises alarm signal generating means having:

potential generating means for lowering said backup power source potential to be supplied to said backup power source potential node to transmit said lowered backup power source potential; and comparison means for subjecting said backup power source potential lowered by said potential generating means and a reference potential to a comparison to transmit an alarm signal if said lowered backup power source potential is lower than said reference potential.

10. The semiconductor integrated circuit for controlling a power source according to claim 7 wherein said potential generating means has first to third resistor devices in series connected between said external power source potential node and said ground node and a switching device connected in parallel to said first resistor device to transmit said first or second power source potential to a connection point between said second resistor device and said third resistor device, and said switching device is made non-conductive if said setting signal to be supplied to said setting node is in said first state and made conductive if said setting signal is in said second state.

11. The semiconductor integrated circuit for controlling a power source according to claim 10 further comprises alarm signal generating means having:

potential generating means for lowering said backup power source potential to be supplied to said backup power source potential node to transmit said lowered backup power source potential; and comparison means for subjecting said backup power source potential lowered by said potential generating means and a reference potential to a comparison to transmit an alarm signal if said lowered backup power source potential is lower than said reference potential.

12. The semiconductor integrated circuit for controlling a power source according to claim 1 wherein said power source switching means has switching means consisting of two transistor devices in series connected between said internal power source potential node and said backup power source potential node in such a manner that said two transistor devices have diode functions in opposite directions, and said two transistor devices respectively are made conductive or non-conductive in response to a switching signal from said power source potential discriminating means.

13. The semiconductor integrated circuit for controlling a power source according to claim 12 wherein said power source switching means includes:

first switching means consisting of two transistor devices in series connected between said internal power source potential node and said first backup power source potential node in such a manner that said two transistor devices have diode functions in opposite directions and that said first transistor device is connected to said internal power source potential node and said second transistor device is connected to said first backup power source potential node;

second switching means connected between said internal power source potential node and said second backup power source potential node; and bypass means having a plurality of diode devices and resistor devices in series connected between said internal power source potential node and said first backup power source potential node in a forward direction from said first backup power source potential node to said internal power source potential node.

14. The semiconductor integrated circuit for controlling a power source according to claim 13 further comprises alarm signal generating means having:

potential generating means for lowering said backup power source potential to be supplied to said backup power source potential node to transmit said lowered backup power source potential; and comparison means for subjecting said backup power source potential lowered by said potential generating means and a reference potential to a comparison to transmit an alarm signal is said lowered backup power source potential is lower than said reference potential.

15. The semiconductor integrated circuit for controlling a power source according to claim 12 wherein said power source switching means includes:

first switching means consisting of two transistor devices in series connected between said internal power source potential node and said first backup power source potential node in such a manner that said two transistor devices have diode functions in opposite directions and that said first transistor device is connected to said first backup power source potential node and said second transistor device is connected to said internal power source potential node;

second switching means connected between said internal power source potential node and said second backup power source potential node; and bypass means having a plurality of diode devices and resistor devices in series connected between said internal power source potential node and said first backup power source potential node in a forward direction from said first backup power source potential node to said internal power source potential node.

16. The semiconductor integrated circuit for controlling a power source according to claim 15 further comprises alarm signal generating means having:

potential generating means for lowering said backup power source potential to be supplied to said backup power source potential node to transmit said lowered backup power source potential; and comparison means for subjecting said backup power source potential lowered by said potential generating means and a reference potential to a comparison to transmit an alarm signal if said lowered backup power source potential is lower than said reference potential.

17. The semiconductor integrated circuit for controlling a power source according to claim 12 wherein said power source switching means includes:

switching means consisting of two transistor devices in series connected between said internal power source potential node and said backup power source potential node in such a manner that said two transistor devices have diode functions in opposite directions and that said first transistor device is connected to said internal power source potential node and said second transistor device is connected to said backup power source potential node; and bypass means having a plurality of diode devices and resistor devices in series connected between said internal power source potential node and said backup power source potential node in a forward direction from said backup power source potential node to said internal power source potential node.

18. A semiconductor integrated circuit for controlling a power source according to claim 17 further comprises alarm signal generating means having:

potential generating means for lowering said backup power source potential to be supplied to said backup power source potential node to transmit said lowered backup power source potential; and comparison means for subjecting said backup power source potential lowered by said potential generating means and a reference potential to a comparison to transmit an alarm signal if said lowered backup power source potential is lower than said reference potential.

19. The semiconductor integrated circuit for controlling a power source according to claim 12 wherein said power source switching means includes:

switching means consisting of two transistor devices in series connected between said internal power source potential node and said backup power source potential node in such a manner that said two transistor devices have diode functions in opposite directions and that said first transistor device is connected to said internal power source potential node and said second transistor device is connected to said backup power source potential node; and bypass means having a plurality of diode devices and resistor devices in series connected between said internal power source potential node and said backup power source potential node and having diode functions in a forward direction from said backup power source potential node to said internal power source potential node.

20. The semiconductor integrated circuit for controlling a power source according to claim 19 further comprises alarm signal generating means having:

potential generating means for lowering said backup power source potential to be supplied to said backup power source potential node to transmit said lowered backup power source potential; and comparison means for subjecting said backup power source potential lowered by said potential generating means and a reference potential to a comparison to transmit an alarm signal if said lowered backup power source potential is lower than said reference potential.

* * * * *